(12) United States Patent
Lim et al.

(10) Patent No.: US 10,924,867 B2
(45) Date of Patent: *Feb. 16, 2021

(54) MICROPHONE PACKAGE

(71) Applicant: Knowles Electronics, LLC, Itasca, IL (US)

(72) Inventors: Tony K. Lim, Naperville, IL (US); John Szczech, Itasca, IL (US); Joshua Watson, Itasca, IL (US)

(73) Assignee: Knowles Electroics, LLC, Itasca, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/852,298

(22) Filed: Apr. 17, 2020

(65) Prior Publication Data

US 2020/0245078 A1 Jul. 30, 2020

Related U.S. Application Data

(63) Continuation of application No. 16/128,489, filed on Sep. 11, 2018, now Pat. No. 10,631,099, and a
(Continued)

(51) Int. Cl.
*H04R 19/04* (2006.01)
*B81B 7/00* (2006.01)
(Continued)

(52) U.S. Cl.
CPC ........... *H04R 19/04* (2013.01); *B81B 7/0019* (2013.01); *B81B 7/0025* (2013.01); *H04R 1/04* (2013.01);
(Continued)

(58) Field of Classification Search
USPC .... 381/26, 92, 361, 113, 114, 116, 111, 122
See application file for complete search history.

(56) References Cited

U.S. PATENT DOCUMENTS 7,190,038 B2  3/2007 Dehe et al.
7,473,572 B2  1/2009 Dehe et al.
(Continued)

FOREIGN PATENT DOCUMENTS

CN           1813490 A      8/2006
DE  10 2014 100 743 A1     7/2014
(Continued)

OTHER PUBLICATIONS

International Search Report and Written Opinion, PCT/US2018/050533, Knowles Electronics, LLC (dated Nov. 30, 2018).
(Continued)

*Primary Examiner* — Yosef K Laekemariam
(74) *Attorney, Agent, or Firm* — Foley & Lardner LLP

(57) ABSTRACT

A microphone includes a housing including a substrate and a cover disposed over the substrate, the housing including a sound port between the interior of the housing and the exterior of the housing. The microphone also includes a microelectromechanical systems (MEMS) transducer and an integrated circuit (IC) positioned within the housing and mounted on a common surface of the housing, where the MEMS transducer is electrically connected to the IC, and the IC is electrically connected to a conductor on the substrate. The microphone further includes an encapsulating material covering the IC, and an encapsulating material confinement structure disposed between the MEMS transducer and the IC, where the encapsulating material confinement structure at least partially confines the encapsulating material around the IC.

20 Claims, 15 Drawing Sheets

Related U.S. Application Data continuation-in-part of application No. 15/988,983, filed on May 24, 2018, now Pat. No. 10,547,955.

(60) Provisional application No. 62/557,613, filed on Sep. 12, 2017, provisional application No. 62/511,221, filed on May 25, 2017.

(51) Int. Cl.
| | | |
|---|---|---|
| *H04R 1/04* | (2006.01) | |
| *H04R 19/00* | (2006.01) | |
| *H04R 1/08* | (2006.01) | |
| *H04R 3/06* | (2006.01) | |

(52) U.S. Cl.
CPC .... *H04R 19/005* (2013.01); *B81B 2201/0257* (2013.01); *B81B 2207/012* (2013.01); *B81C 2203/0109* (2013.01); *B81C 2203/0792* (2013.01); *H04R 1/086* (2013.01); *H04R 3/06* (2013.01); *H04R 2201/003* (2013.01)

(56) References Cited

U.S. PATENT DOCUMENTS

| | | |
|---|---|---|
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 8,018,049 B2 | 9/2011 | Minervini |
| 9,640,531 B1 | 5/2017 | Or-Bach et al. |
| 2005/0018864 A1 | 1/2005 | Minervini |
| 2005/0207605 A1 | 9/2005 | Dehe et al. |
| 2007/0205499 A1 | 9/2007 | Wang et al. |
| 2007/0222008 A1* | 9/2007 | Chen ............... B81C 1/00896 257/415 |
| 2007/0278501 A1 | 12/2007 | MacPherson et al. |
| 2008/0037768 A1 | 2/2008 | Hsu et al. |
| 2008/0056524 A1 | 3/2008 | Sakakibara et al. |
| 2008/0130935 A1 | 6/2008 | Sato et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0045498 A1 | 2/2009 | Braden et al. |
| 2009/0180655 A1 | 7/2009 | Tien et al. |
| 2010/0046780 A1* | 2/2010 | Song ............... H04R 19/016 381/361 |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2013/0105952 A1 | 5/2013 | Fontana et al. |
| 2014/0029078 A1* | 1/2014 | Fennell ............... G02B 26/001 359/238 |
| 2014/0246739 A1 | 9/2014 | Protheroe et al. |
| 2014/0367810 A1 | 12/2014 | Vos et al. |
| 2015/0189446 A1 | 7/2015 | Wang et al. |
| 2016/0100256 A1 | 4/2016 | Watson et al. |

FOREIGN PATENT DOCUMENTS

| | | |
|---|---|---|
| DE | 10 2014 100 464 A1 | 7/2015 |
| EP | 2 963 946 A2 | 1/2016 |
| WO | WO-2016/075113 A1 | 5/2016 |
| WO | WO-2016/153871 A1 | 9/2016 |

OTHER PUBLICATIONS

International Search Report and Written Opinion, PCT/US2018/034475, Knowles Electronics, LLC (dated Oct. 25, 2018).

* cited by examiner

MICROPHONE PACKAGE

CROSS REFERENCE TO RELATED APPLICATIONS

This application is a continuation application of co-pending U.S. patent application Ser. No. 16/128,489, filed Sep. 11, 2018, entitled "Microphone Package." U.S. patent application Ser. No. 16/128,489 claims benefit under § 119(e) to U.S. Provisional Patent Application No. 62/557,613, filed Sep. 12, 2017, entitled "Microphone Package," and is a continuation-in-part of U.S. patent application Ser. No. 15/988,983, filed May 24, 2018, entitled "Microphone Package for Fully Encapsulated ASIC and Wires," and issued as U.S. Pat. No. 10,547,955, which claims benefit under § 119(e) to U.S. Provisional Patent Application No. 62/511,221, filed May 25, 2017, entitled "Microphone Package for Fully Encapsulated ASIC and Wires." The entire contents of each of the above mentioned applications are incorporated herein by reference.

BACKGROUND

In a micro electro mechanical system (MEMS) microphone, a MEMS die includes at least one diaphragm and at least one back plate. The MEMS die is supported by a base or substrate and enclosed by a housing (e.g., a cup or cover with walls). A port may extend through the substrate (for a bottom port device) or through the top of the housing (for a top port device). Sound energy traverses through the port, moves the diaphragm, and creates a changing electrical potential of the back plate, which creates an electrical signal. Microphones are deployed in various types of devices such as personal computers, cellular phones, mobile devices, headsets, and hearing aid devices.

SUMMARY

In an aspect of the disclosure a microphone includes a housing including a substrate and a cover disposed over the substrate, the housing including a sound port between the interior of the housing and the exterior of the housing. The microphone also includes a microelectromechanical systems (MEMS) transducer and an integrated circuit (IC) positioned within the housing and mounted on a common surface of the housing, where the MEMS transducer is electrically connected to the IC, and the IC is electrically connected to a conductor on the substrate. The microphone further includes an encapsulating material covering the IC, and an encapsulating material confinement structure disposed between the MEMS transducer and the IC, where the encapsulating material confinement structure at least partially confines the encapsulating material around the IC.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

Figure 1:
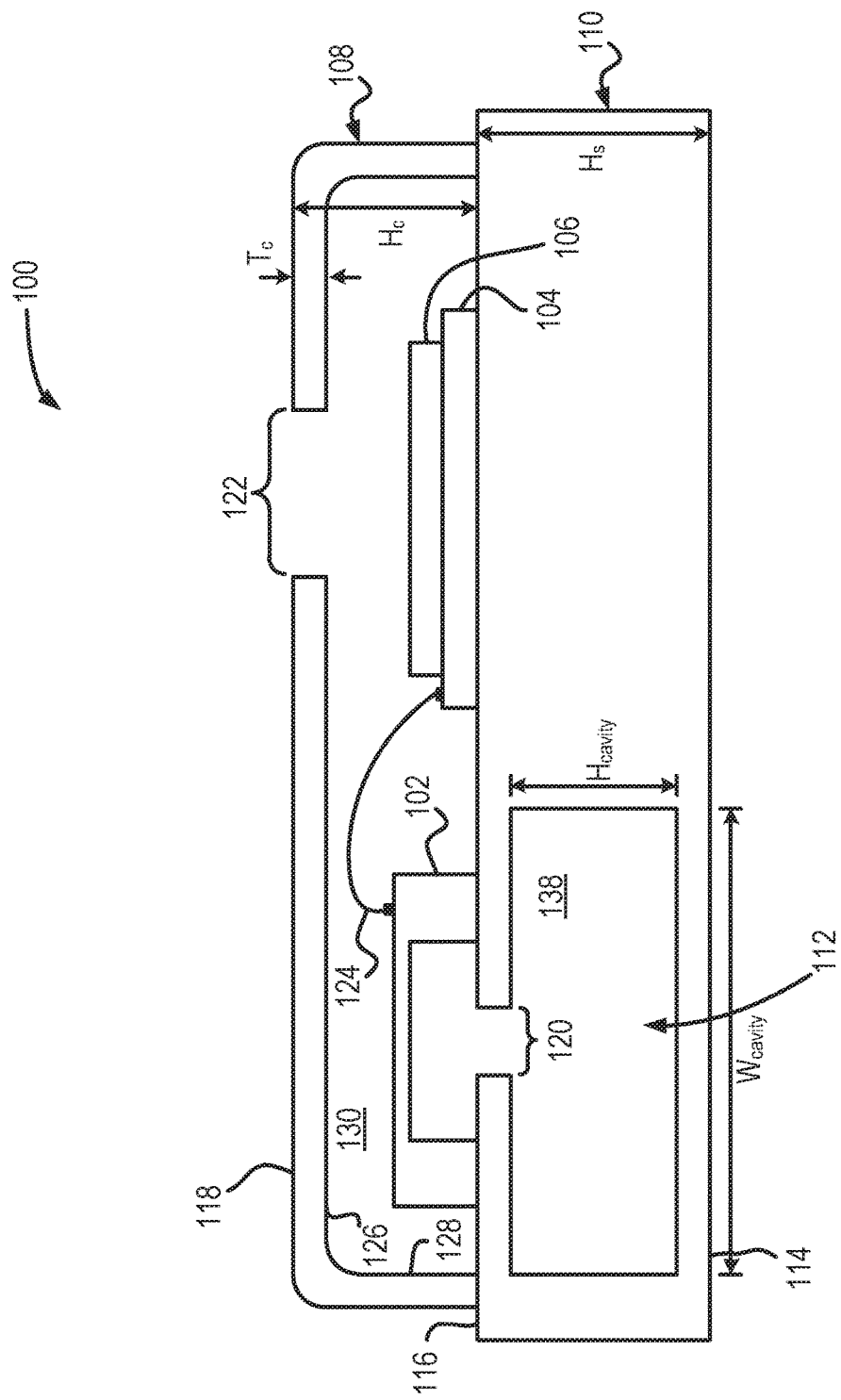
FIG. 1 is a representation of a cross-sectional view of first example microphone device according to embodiments of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

The present disclosure describes devices and techniques for improving robustness of microphone devices and pressure-sensing transducers, such as those incorporating microelectromechanical systems (MEMS) transducers. In some embodiments, the devices and techniques described in the present disclosure improve a signal-to-noise ratio of a top-port microphone device by including an embedded cavity within a substrate. A height of the substrate can be greater than a height of a cover which includes the acoustic port.

In one or more embodiments, the microphone device can include an encapsulating material at least partially covering an integrated circuit electrically connected to the MEMS transducer, and the cover can include a thin region positioned above the encapsulating material. The thin region provides additional area to accommodate the encapsulating material without having to increase the height of the cover or increase the front volume (discussed below) of the enclosure which could negatively impact electro-acoustic performance.

In one or more embodiments, the microphone device can include a sealed port positioned under the integrated circuit. During manufacturing, the sealed port can aid in removing debris trapped in the embedded cavity in the substrate.

In one or more embodiments, the microphone device can include a multilayered substrate, in which electrical components such as resistors and capacitors can be formed. By forming the components within the substrate instead of on a top surface of the substrate, the overall size of the microphone device can be reduced.

In one or more embodiments, a particulate filter can be positioned between the MEMS transducer and an opening to the embedded cavity. The particulate filter can reduce the risk of debris trapped in the embedded cavity from making contact with a diaphragm of the MEMS transducer, thereby improving the reliability of the microphone device.

In one or more embodiments, the microphone device can include a cover bonding ring for bonding the cover to the substrate. The cover bonding ring can include a notch or a cut-out which can be filled with an adhesive, such as epoxy, to reduce the risk of the cover getting detached from the substrate during manufacturing or installation of the microphone device.

In one or more embodiments, the microphone device includes a surface cavity which accommodates the integrated circuit and the encapsulating material, thereby reducing the risk of the encapsulating material making contact with the MEMS transducer during manufacture. In one or more embodiments, the microphone device can include a platform on which the MEMS transducer can be placed, so as to isolate the MEMS transducer from the encapsulating material.

FIG. 1 is a cross-sectional view of first example microphone device 100 according to an embodiment of the present disclosure. The first example microphone device 100 includes a substrate 110, a microelectromechanical systems (MEMS) transducer 102, a first integrated circuit (IC) 104, a second IC 106, and a cover 108. The substrate 110 includes first surface (a front surface 116) and an opposing second surface (a back surface 114). The MEMS transducer 102 and the first IC 104 are disposed on the front surface 116 of the substrate 110, while the second IC 106 is disposed on a top surface of the first IC 104. Wires 124 electrically connect the MEMS transducer 102 to the first IC 104. While not shown, wires can also connect the MEMS transducer 102 to the second IC 106. In addition, wires can also connect each of the MEMS transducer 102, the first IC 104, and the second IC 106 to the substrate 110. The MEMS transducer 102, the first IC 104, the second IC 106, and the substrate 110 can each include conductive bounding pads to which ends of the wires can be bonded. In some embodiments, wires 124 can be bonded to the appropriate bonding pads using a solder.

The cover 108 can be affixed on the front surface 116 of the substrate 110 to enclose and protect the MEMS transducer 102, the first IC 104, the second IC 106, and any bonding wires. The cover 108 can include materials such as plastic or metal. The cover 108 can define a through hole or a top port 122 that extends between an outer top surface 118 and an inner top surface 126 of the cover 108. The cover 108 can have a cover height $H_c$ defined by a distance of the outer top surface 118 from the front surface 116 of the substrate 110. In some implementations, the cover height $H_c$ can be about 0.3 mm to about 0.7 mm, or about 0.4 mm to about 0.6 mm, or about 0.55 mm. The cover 108 can have a thickness $T_c$ defined by a distance between the outer top surface 118 and the inner top surface 126. In some implementations, the thickness of the cover 108 can be uniform, while in other implementations, the thickness of the cover 108 can be non-uniform. Viewed in a direction that is normal to the outer top surface 118 of the cover 108, the cover 108 can have a substantially rectangular, circular, elliptical, or any polygonal shape. The inner top surface 126 of the cover 108, inner side surfaces 128 of the cover 108, and the exposed portions, inside the cover 108, of the front surface 116, the MEMS transducer 102, the first IC 104, and the second IC 106 define a front volume 130. The front volume 130, a diaphragm of the MEMS transducer 102, and a back volume (discussed below) can, in combination, contribute to the acoustic characteristics of the first example microphone device 100.

The substrate 110 can include, without limitation, a printed circuit board, a semiconductor substrate, or a combination thereof. The substrate 110 can have a substrate height $H_s$ defined by the distance between the front surface 116 and the back surface 114. In some implementations, the height $H_s$ of the substrate 110 can be about 0.3 mm to about 1.8 mm, or about 0.5 mm to about 0.8 mm, or about 0.65 mm. In some implementations, the height $H_s$ of the substrate 110 can be greater than the height $H_c$ of the cover 108. The substrate 110 can define an embedded cavity 112 disposed between the front surface 116 and the back surface 114. The substrate 110 also can define a port 120 that extends between the front surface 116 and the embedded cavity 112. The port 120 is positioned below the MEMS transducer 102 such that the embedded cavity 112 is in fluid communication with a diaphragm of the MEMS transducer 102. In some implementations, the substrate 110 can define one or more ports in addition to the port 120 that extends between the front surface 116 and the embedded cavity 112. The additional port or ports, like the port 120, can provide fluid communication between the embedded cavity 112 and one or more diaphragms of the MEMS transducer 102. For example, the MEMS transducer can be a multi-motor MEMS transducer that can include two or more diaphragms. The substrate 110 can define an additional port extending between the front surface 116 and the embedded cavity 112, such that the port 120 is positioned under a first diaphragm and the additional port is positioned under a second diaphragm of the multi-motor MEMS transducer. In some implementations, the additional ports, like the port 120, can provide fluid communication between the embedded cavity 112 and additional MEMS transducers, like the MEMS transducer 102. As an example, each of the MEMS transducer may include a single diaphragm.

The embedded cavity 112 can have a height $H_{cavity}$, a width $W_{cavity}$, and a length $L_{cavity}$ (not shown). The height $H_{cavity}$ of the embedded cavity 112 is less than the height $H_s$ of the substrate 110. In some implementations, the height $H_{cavity}$ of the embedded cavity 112 can be about 60% to about 20%, or about 50% to about 30%, or about 40% of the height $H_s$ of the substrate 110. A back volume 138 is formed by the embedded cavity 112, in addition to a volume defined by the port 120 and a volume defined by the MEMS transducer 102 in relation to the front surface 116 of the substrate 110. The front volume 130 to back volume 138 ratio can affect the acoustic characteristics of the first example microphone device 100, such as, for example, a signal-to-noise ratio (SNR) of the first example microphone device 100. For example, reducing the front volume 130 to back volume 138 ratio can improve the SNR of the first microphone device. In one or more embodiments, the front volume 130 to back volume 138 ratio can range from about 0.5 to about 3.

The MEMS transducer 102 can include a conductive diaphragm positioned in a distance relationship with a conductive back plate. The diaphragm is configured to move in relation to the back plate in response to incident acoustic signals. The movement of the diaphragm in relation to the back plate causes a capacitance associated with the MEMS transducer 102 to vary. The change in the capacitance of the MEMS transducer 102 in response to the acoustic signals can be measured and converted into a corresponding electrical signal. The MEMS transducer 102 can include one or more diaphragms that can move in relation to one or more back plates.

The first IC 104 and the second IC 106 can include analog and/or digital circuitry for processing electrical signals received from the MEMS transducer 102. In one or more embodiments, the first IC 104 and the second IC 106 can be an integrated circuit packages having a plurality of pins or bonding pads that facilitate electrical connectivity to components outside of the first IC 104 and the second IC 106 via wires. In particular, the first IC 104 can include bonding pads to which the first set of wires 124 can be connected. Bonding pads can also be present on the second IC 106 for connecting another set of wires between the MEMS transducer 102 and the second IC 106. The analog or digital circuitry can include amplifiers, filters, analog-to-digital converters, digital signal processor, and other electrical circuitry for processing the electrical signals received from the MEMS transducer 102 and other components on the substrate 110. In some implementations, the second IC 106 can include a digital signal processor, while the first IC 104 can include additional circuitry. In some implementations, the second IC 106 may not be present, and the circuitry that would have been included in the second IC 106 can instead be included in the first IC 104. The first IC 104 and the second IC 106 can also include additional bond pads for bonding wires connecting the respective IC to conductors on the front surface 116 of the substrate 110 and for bonding wires connecting the first IC 104 to the second IC 106. In one or more embodiments, the first IC 104 and the second IC 106 can have a light sensitivity coating that blocks light from entering the circuitry inside the IC 104. In one or more embodiments, one or more bonding pads on the first IC 104, the second IC 106, and the substrate 110 can be gold bonding pads. Using gold bonding pads can improve corrosion resistance due to exposure to moisture and other environmental substances through the top port 122. Corrosion resistance can be also reduced by coating the bonding pads with an anti-corrosive material.

Figure 2:
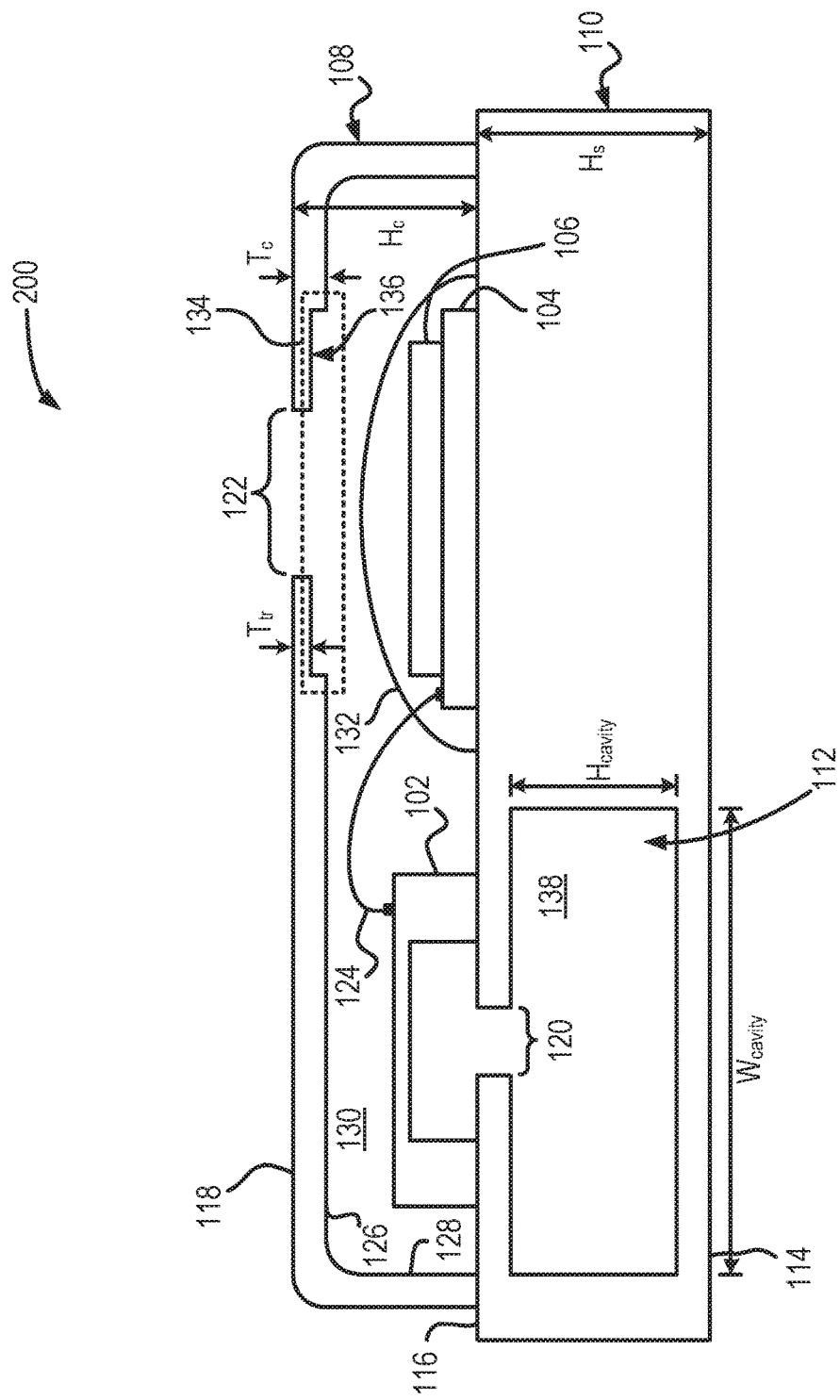
FIG. 2 is a representation of a cross-sectional view of a second example microphone device according to embodiments of the present disclosure.

FIG. 2 is a cross-sectional view of a second example microphone device 200 according to an embodiment of the present disclosure. The second example microphone device 200 is similar in many respects to the first example microphone device 100 discussed above in relation to FIG. 1, and features described herein with respect to FIG. 1 or similar components of the other embodiments described herein can be applied to any of the corresponding components of the various embodiments unless otherwise indicated. The second example microphone device 200 further includes an encapsulating material 132 and a thin region 134. The encapsulating material 132 at least partially covers the first IC 104 and the second IC 106 and/or any wires (not shown) that extend between the first IC 104, the second IC 106 and the substrate 110, in some embodiments. In one or more embodiments, the encapsulating material 132 completely covers the first IC 104 and the second IC 106 and/or any wires (not shown) that extend between the first IC 104, the second IC 106 and the substrate 110. In one or more embodiments, the encapsulating material 132 can completely cover the first IC 104 and the second IC 106, and at least partially cover any wires extending between the first IC 104, the second IC 106, and the substrate 110. The encapsulating material 132 can be a non-conductive material such as epoxy. One process stage during the manufacturing of the second example microphone device 200 can include a deposition of the encapsulating material 132 over the first IC 104 and the second IC 106.

The encapsulating material 312 can be deposited such that it at least partially covers (or in some instances, completely covers) the first IC 104, the second IC 106 and wires extending to the substrate 110. During deposition, the encapsulating material 132 can be in a high temperature and low viscosity state. Over time, the encapsulating material 132 cools and solidifies to form a covering over the first IC 104, the second IC 106 and wires extending to the substrate 110. In some instances, during deposition, the low viscosity of the encapsulating material 132 can result in lateral spreading of the encapsulating material. In some such instances, where the first IC 104 and the MEMS transducer 102 are disposed on the same front surface 116 of the substrate 110, the lateral spreading of the encapsulating material 132 may result in the encapsulating material 132 making contact with the MEMS transducer 102. This may damage or adversely impact electro-acoustic performance of the MEMS transducer 102. In one or more embodiments, in addition to, or instead of, an encapsulating material 132, the first IC 104 and the second IC 106 can have a light sensitivity coating that blocks light from entering the circuitry inside the IC 104. In one or more embodiments, one or more bonding pads on the first IC 104, the second IC 106, and the substrate 110 can be gold bonding pads. Using gold bonding pads can improve corrosion resistance due to exposure to moisture and other environmental substances through the top port 122. Corrosion resistance can be also reduced by coating the bonding pads with an anti-corrosive material.

To reduce the risk of damage to the MEMS transducer 102, the front surface 116 of the substrate 110 can have a cavity (not shown) formed in the front surface 116 of the substrate 110, and the first IC 104, the second IC 106, and the encapsulating material 132 can be partially or wholly disposed within the cavity. The lateral spreading of the encapsulating material 132, during and after deposition, can be confined to within the sidewalls of the cavity. Thus, the MEMS transducer 102 and other components mounted on the substrate 110 can be protected from undesirable contact with the encapsulating material 132.

The thin region 134 can be formed on the cover 108 near the top port 122. The thin region 134 can include a stepped inner top surface 136, which is stepped, or indented, in relation to the inner top surface 126. In particular, the stepped inner top surface 136 is stepped in the direction of the outer top surface 118. A distance between the stepped inner top surface 136 and the outer top surface 118 defines a thin region 134 thickness $T_{tr}$, which is less than the thickness $T_c$ of the cover 108 defined by the distance between the inner top surface 126 and the outer top surface 118. In some implementations, the thickness $T_{tr}$ of the thin region 134 can be about 30% to about 70% of the thickness $T_c$ of the cover 108, or about 40% to about 60% of the thickness $T_c$ of the cover 108, or about 50% of the thickness $T_c$ of the cover 108. The thin region 134 can be formed along a periphery of the top port 122. The stepped inner top surface 136 can have a perimeter that forms at least a portion of a perimeter of the top port 122. In some implementations, the stepped inner top surface 136 can entirely surround the top port 122. In some implementations, the thin region 134 can be positioned near the top port 122 such that the perimeter of the thin region 134 is separated from the perimeter of the top port 122. The shape of the perimeter of the thin region 134, when viewed in a direction normal to the inner top surface 126, can be any regular or irregular polygonal shape, or curved shape. The reduced thickness of the cover 108 at the thin region 134 allows clearance to accommodate the encapsulating material 132 disposed on the substrate 110 without having to increase the height $H_c$ of the cover 108, and thereby increasing the front volume 130. The second example microphone device 200 also can incorporate indented portions in the cover 108 and other features of a microphone device discussed in the commonly owned U.S. patent application Ser. No. 15/154,545, the subject matter of which is incorporated herein by reference in its entirety.

Figure 3:
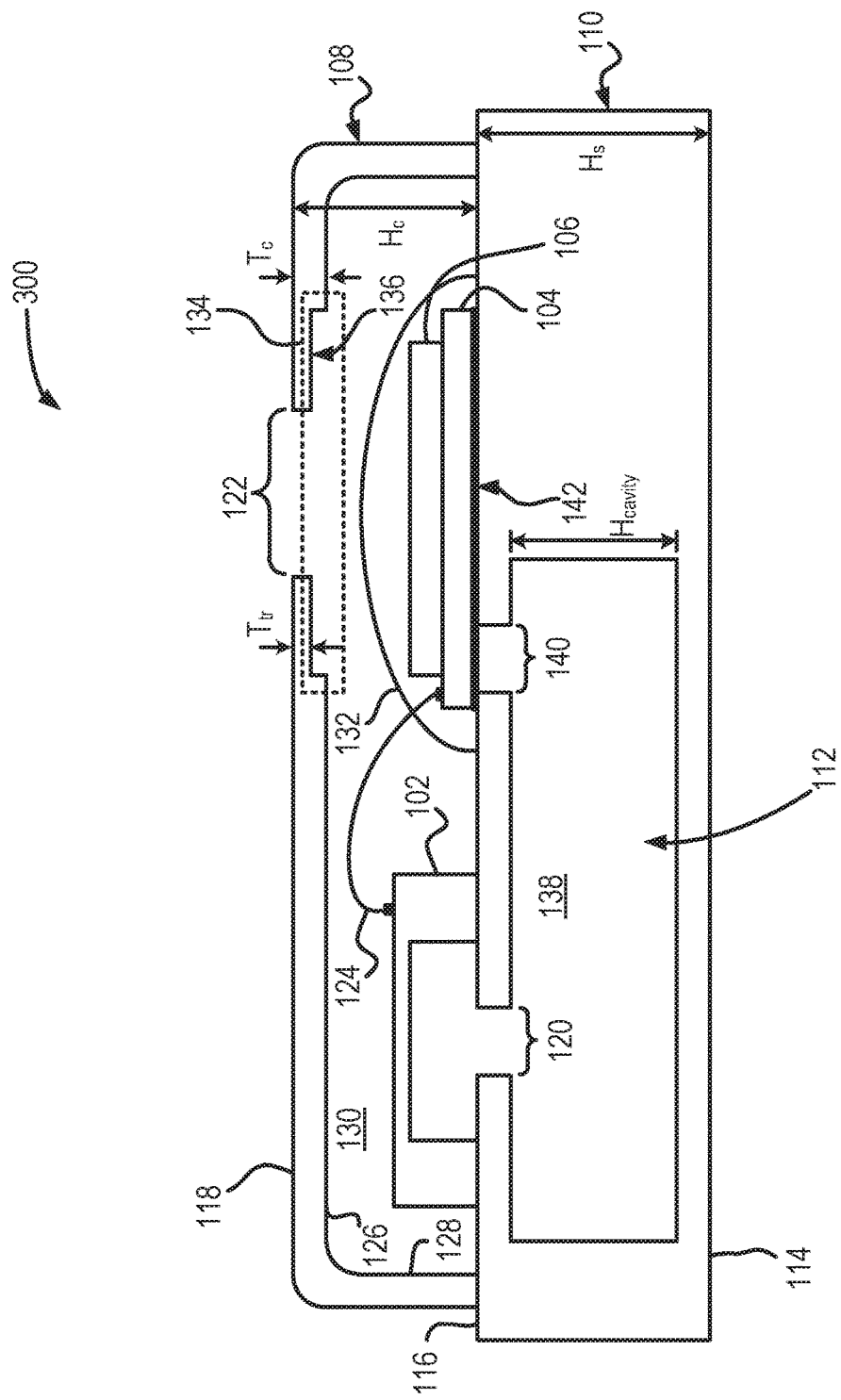
FIG. 3 is a representation of a cross-sectional view of a third example microphone device according to embodiments of the present disclosure.

FIG. 3 is a cross-sectional view of a third example microphone device 300 according to an embodiment of the present disclosure. The third example microphone device 300 is similar in many respects to the second example microphone device 200 discussed above in relation to FIG. 2. To the extent that some features of the third example microphone device 300 are similar to those of the second example microphone device 200, such features are provided with the same reference numerals in both FIGS. 2 and 3. The third example microphone device 300 further includes a sealed port 140. As discussed above, the front surface 116 defines the port 120 (and any additional ports), which extends between the front surface 116 and the embedded cavity 112 and is positioned under the MEMS transducer 102. The front surface 116 also defines the sealed port 140, which also extends between the front surface 116 and the embedded cavity 112. However, unlike the port 120, which is disposed under the MEMS transducer 102, to provide fluid communication between the diaphragm and the embedded cavity 112, the sealed port 140 is instead positioned outside of a perimeter of the MEMS transducer formed on the front surface 116.

The sealed port 140 can be positioned, for example, under the first IC 104, such that the sealed port 140 is covered by the first IC 104. In some instances, a dispensed die attach or preferably die attach film 142 may be used to adhere the first IC 104 to the front surface 116 of the substrate 110. The die attach film 142 can include an adhesive that can aid in bonding the first IC 104 to the front surface 116. In some such instances, the die attach film 142 can be used to cover and seal the sealed port 140. The sealed port 140 can aid in removing debris deposited within the embedded cavity 112 during manufacturing. For example, during the formation of the embedded cavity 112 or other features of the substrate 110, debris may get trapped in the embedded cavity 112. This debris, if not removed from the embedded cavity 112, may come in contact with the diaphragm of the MEMS transducer 102, resulting in an increased risk of damage to the MEMS transducer 102. The formation of the sealed port 140 in the substrate 110 (prior to the placement of the first IC 104 or the die attach film 142) can aid in removing the debris from the embedded cavity 112. For example, air can be blown through one of the port 120 and the sealed port 140 to allow debris to be flushed out via the other of the port 120 and the sealed port 140. Once the debris is removed, the first IC 104 or the die attach film 142 can be positioned over the front surface 116 to seal the sealed port 140. In some implementations, the sealed port 140 can be completely sealed from the front volume 130. In some other implementations, the sealed port 140 may be partially sealed from the front volume 130. The sealed port 140 may not contribute to the acoustic characteristics of the third example microphone device 300. As mentioned above, the substrate can define one or more ports positioned under the MEMS transducer 102 to correspond to one or more diaphragms. The sealed port 140 can be provided under the first IC 104 in addition to the one or more ports provided under the MEMS transducer 102.

Figure 4A:
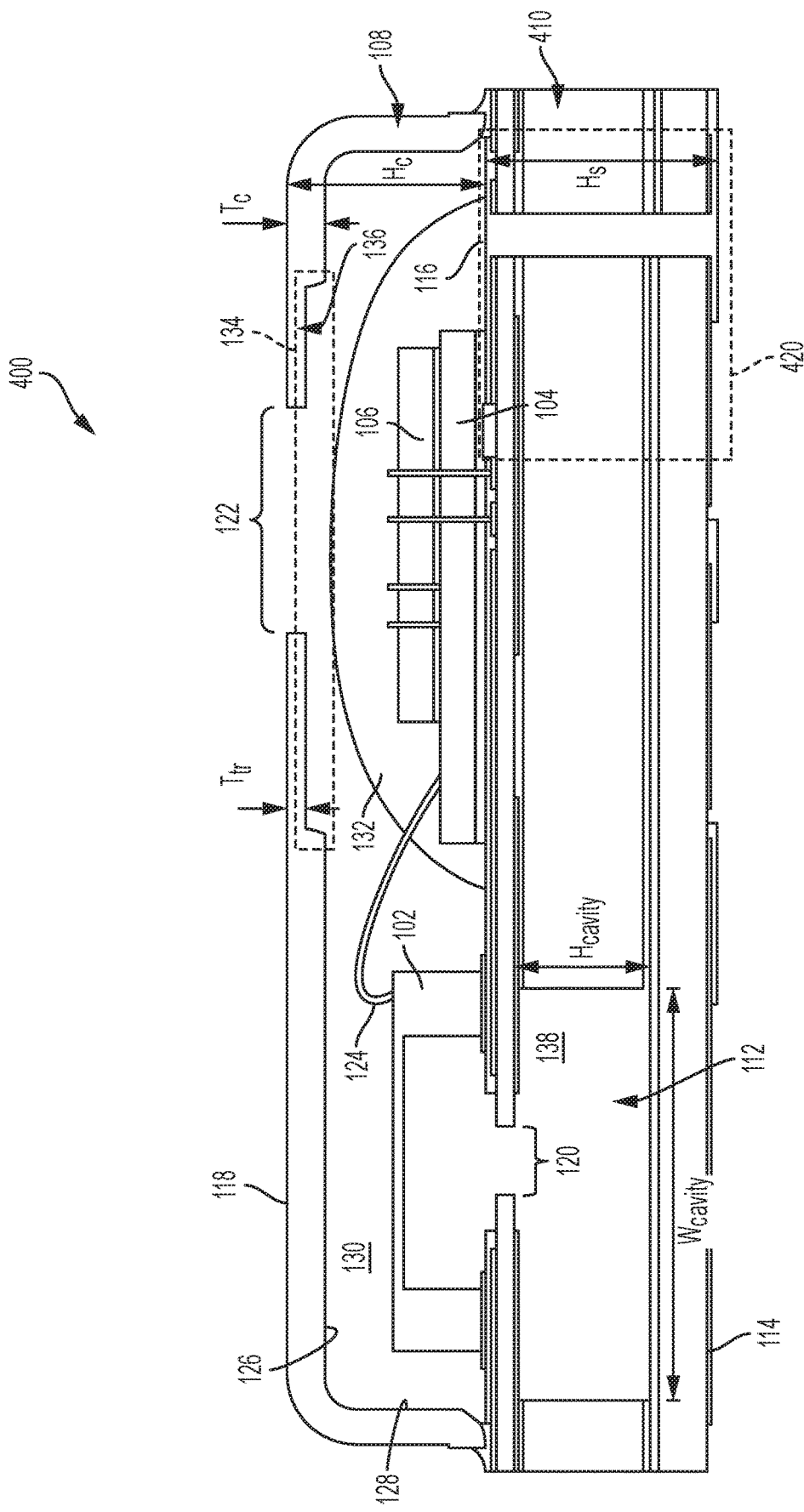
FIG. 4A is a representation of a cross-sectional view of a fourth example microphone device according to embodiments of the present disclosure.

FIG. 4A is a cross-sectional view of a fourth example microphone device 400 according to an embodiment of the present disclosure. The fourth example microphone device 400 is similar in many respects to the second example microphone device 200 discussed above in relation to FIG. 2. To the extent that some features of the third example microphone device 300 are similar to those of the second example microphone device 200, such features are provided with the same reference numerals in both FIGS. 2 and 4A. The fourth example microphone device 400 includes a multilayered substrate 410. The multilayered substrate 410, similar to the substrate 110 shown in FIG. 2, defines an embedded cavity 112 and a port 120. The multilayered substrate 410 additionally includes multiple layers of materials, and electronic components such as resistors and capacitors.

Figure 4B:
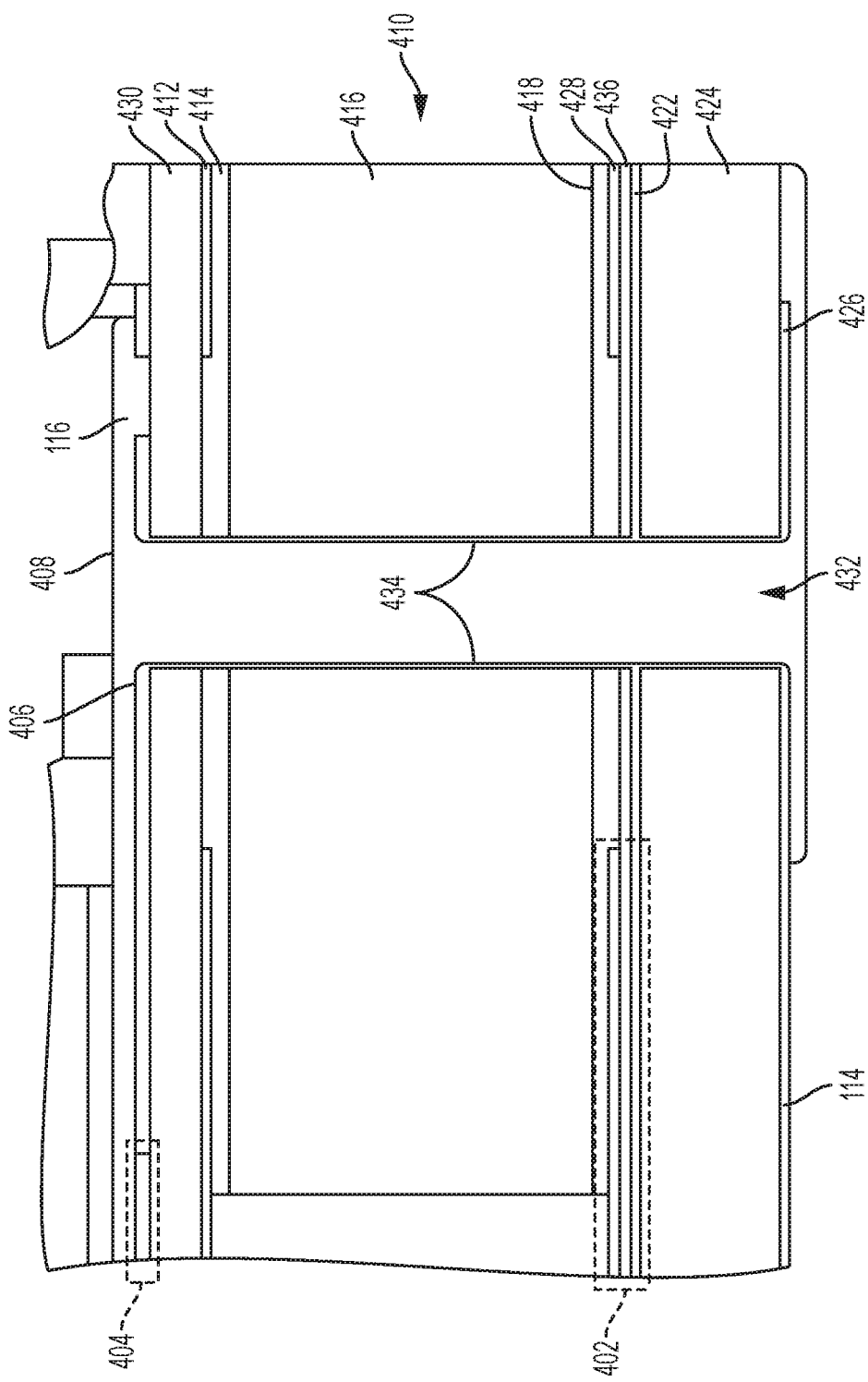
FIG. 4B shows an expanded view of a portion of the fourth example microphone device shown in FIG. 4A.

FIG. 4B shows an expanded view of a portion 420 of the fourth example microphone device 400 shown in FIG. 4A. The multilayered substrate 410 includes a top substrate layer 430, an inner substrate layer 416, and a bottom substrate layer 424. The top substrate layer 430, the inner substrate layer 416, and the bottom substrate layer 424 can include materials such as epoxy, glass-reinforced epoxy, composite fiberglass cloth with epoxy resin (e.g., FR4), and the like. The multilayered substrate 410 can define a plated through-hole 432, which can be filled with a solder mask 408. In one or more embodiments, the plated through-hole 432 can be plated with conductive materials, such as copper or aluminum. A first adhesive layer 414 can be disposed between the top substrate layer 430 and the inner substrate layer 416, and a second adhesive layer 418 can be disposed between the inner substrate layer 416 and the bottom substrate layer 424. A top metal layer 406 can be disposed over the top metal layer 406 on a side of the top substrate layer 430 that is opposite to the side of the top substrate layer 430 that is adjacent to the inner substrate layer 416. The solder mask 408 can cover at least a portion of the top metal layer 406. A bottom metal layer 426 can be disposed on the bottom substrate layer 424 on a side of the bottom substrate layer 424 that is adjacent to the inner substrate layer 416. The solder mask 408 also can cover at least a portion of the bottom metal layer 426. A through-hole metal layer 434 can extend through the plated through-hole 432 between the top metal layer 406 and the bottom metal layer 426, forming an electrical connection therebetween.

The multilayered substrate 410 also includes several inner metal layers, such as the first inner metal layer 412 disposed between the top substrate layer 430 and the inner substrate layer 416, and a second inner metal layer 428 and a third inner metal layer 422 disposed between the inner substrate layer 416 and the bottom substrate layer 424. The second inner metal layer 428 and the third inner metal layer 422 can be separated by a dielectric layer 436. The third inner metal layer 422 can make contact with the through-hole metal layer 434, thereby making electrical contact with the top metal layer 406 and the bottom metal layer 426. In some implementations, the first inner metal layer 412 can be used as a ground terminal, and the second and third inner metal layers 428 and 422 can be used for carrying electrical signals.

The multilayered substrate 410 also can include passive electrical circuit elements such as resistors and capacitors. For example, a resistor 404 can be disposed on the same side of the top substrate layer 430 on which the top metal layer 406 is disposed. One end or terminal of the resistor 404 can form an electrical contact with the top metal layer 406. The resistor 404 can include conductive materials having an electrical resistance that is substantially greater than an electrical resistance of the top metal layer 406. The multilayered substrate 410 also can include a reactive electrical circuit element such as a capacitor 402 disposed between the inner substrate layer 416 and the bottom substrate layer 424. The capacitor 402 can be include a portion of the dielectric layer 436 disposed between a portion of the second inner metal layer 428 and a portion of the third inner metal layer 422. The portion of the second inner metal layer 428 can form a first terminal of the capacitor 402, while the portion of the third inner metal layer 422 can form a second terminal of the capacitor 402. The second terminal of the capacitor 402 can be coupled to the resistor via the through-hole metal layer 434 and the top metal layer 406.

The locations of the resistor 404 and the capacitor 402 shown in FIG. 4B are only examples. The resistor 404 and the capacitor 402 can be located elsewhere within the multilayered substrate 410 as well. For example, the capacitor 402 can be alternatively disposed between the top substrate layer 430 and the inner substrate layer 416, or adjacent to any of the layers of the multilayered substrate 410. The resistor 404 also may be located adjacent to any of the layers of the multilayered substrate 410. While not shown in FIG. 4B, the multilayered substrate 410 can include additional resistors and capacitors, similar to the resistor 404 and the capacitor 402, having various values. In one or more embodiment, the values of the resistor 404 or the additional resistors can range from about 10 ohms to about 100 ohms. In one or more embodiments, the resistor 404 or the additional resistors can have a size in the range of about 75 micrometers to about 150 micrometers in width and the range of about 75 micrometers to about 300 micrometers in length. In one or more embodiments, the thickness of the resistor 404 or the additional resistors can be in the range of about 0.1 micrometer to about 1 micrometer. In one or more embodiments, the values of the capacitor 402 or the additional capacitors can range from about 10 pF to about 300 pF. By forming resistors and capacitors in one or more layers of the multilayered substrate 410, these electrical components, which would have otherwise been disposed over the front surface 116, can now be accommodated within the multilayered substrate 410 itself, resulting in a reduction in radio frequency (RF) interference caused by these electrical components. In some instances, an additional benefit of accommodating these electrical components within the multilayered substrate 410 can be freeing up of space on the front surface 116 to accommodate other components or resulting in a reduction in the overall size of the fourth example microphone device 400.

Figure 5:
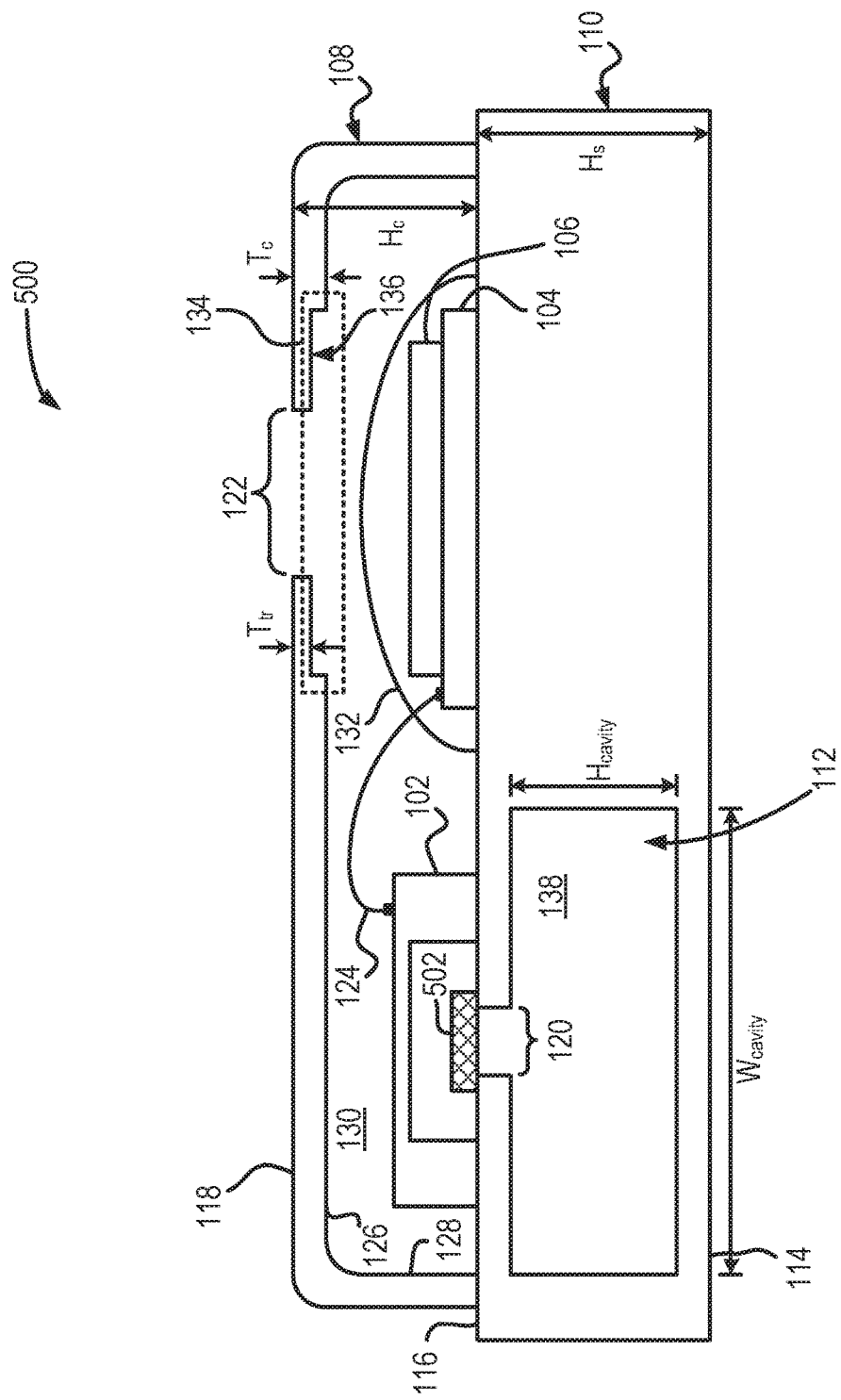
FIG. 5 is a representation of a cross-sectional view of a fifth example microphone device according to embodiments of the present disclosure.

FIG. 5 is a cross-sectional view of a fifth example microphone device 500 according to an embodiment of the present disclosure. The fifth example microphone device 500 is similar in many respects to the second example microphone device 200 discussed above in relation to FIG. 2. To the extent that some features of the fifth example microphone device 500 are similar to those of the second example microphone device 200, such features are provided with the same reference numerals in both FIGS. 2 and 5. The fifth example microphone device 500 can include a particulate filter 502 disposed adjacent the port 120. As mentioned above in relation to the third example microphone device 300 in relation to FIG. 3, manufacturing process of the substrate can result in accumulation of debris within the embedded cavity 112. This debris can increase the risk of damage to the diaphragm of the MEMS transducer 102. The particulate filter 502 reduces the risk of the debris in the embedded cavity 112 making contact with the diaphragm of the MEMS transducer 102. The particulate filter 502 can include perforations having sizes that are sufficiently large such that the particulate filter 502 does not impede the fluid communication between the diaphragm and the embedded cavity 112, but having sizes that are sufficiently small so as to impede debris within the embedded cavity 112 from making contact with the diaphragm. In one or more embodiments, the particulate filter 502 can be comprised of porous ceramic with an effective pore size ranging from about 10 to about 20 micrometers and a porosity between 55 to 65%. Other pore sizes and porosities can also be selected that allow sufficient filtering of debris while maintaining acceptable acoustic transparency of the particulate filter 502. While the particulate filter 502 is shown in FIG. 5 as being disposed on the end of the port 120 that is adjacent to the MEMS transducer 102, the particulate filter 502 can alternatively be disposed on the opposite end of the port 120. That is, the particulate filter 502 can be positioned to cover the end of the port 120 that opens into the embedded cavity 112.

In some implementations, an additional particulate filter can be positioned to cover the top port 122. The top port particulate filter can reduce the risk of debris entering the front volume 130 via the top port 122. The top port particulate filter can be positioned under the top port 122, over the top port 122 or flush within the top port 122, such that a top surface of the top port particulate filter is flush with, or in the same plane as, the outer top surface 118.

Figure 6A:
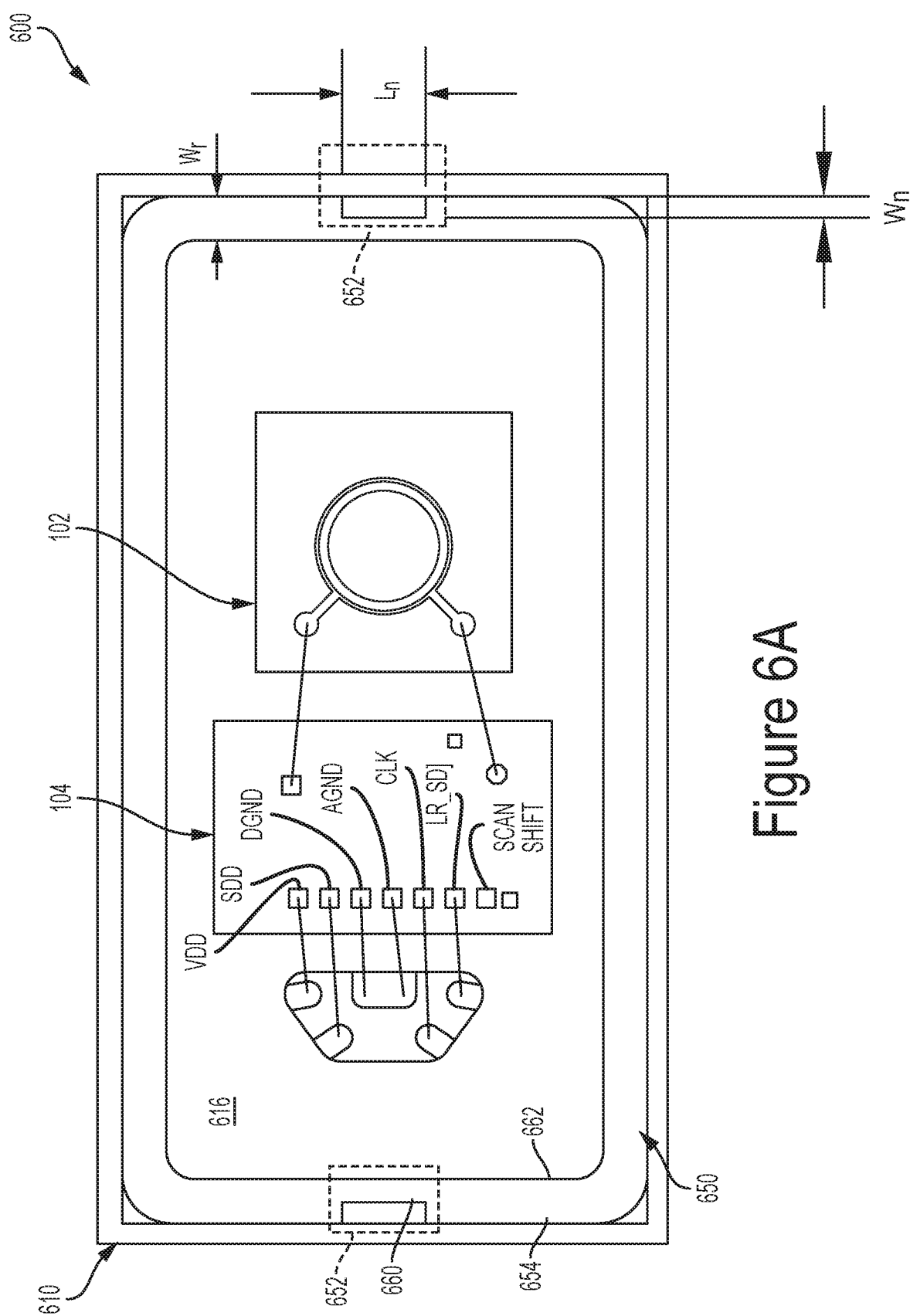
FIG. 6A is a representation of a top view of a seventh example microphone device according to embodiments of the present disclosure.
Figure 6B:
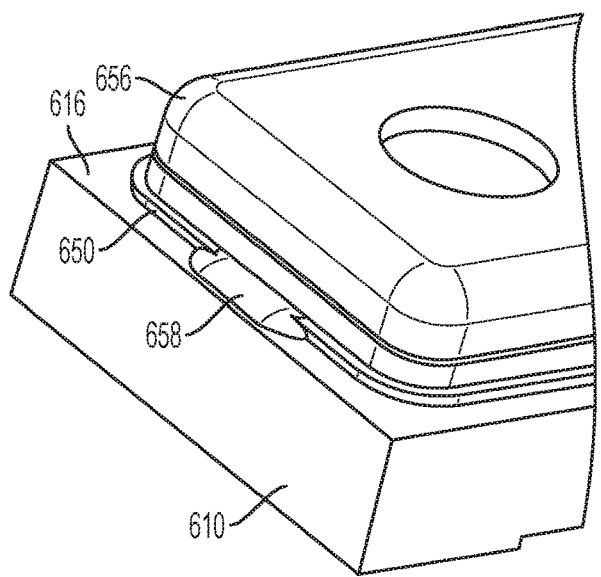
FIG. 6B shows an isometric view of a portion of the seventh example microphone device shown in FIG. 6A.

FIG. 6A is a top view of a sixth example microphone device 600 according to an embodiment of the present disclosure. The top view in FIG. 6A is shown without a cover. FIG. 6B shows an isometric view of a portion of the sixth example microphone device 600 shown in FIG. 6A. The sixth example microphone device 600 includes a substrate 610 having a front surface 616. A first IC 104 and a MEMS transducer 102 are disposed on the front surface 616. The substrate 610 can be similar to the substrate 110 discussed above in relation to FIG. 1. A cover bonding ring 650 is also disposed on the front surface 616. The cover bonding ring 650 has a perimeter that is substantially similar to a perimeter of a cover 656, shown in FIG. 6B. The cover bonding ring 650 can improve the adhesion of the cover 656 to the front surface 616 of the substrate 610. The improved adhesion reduces the risk of the cover 656 becoming dislodged or separated from the substrate 610 and exposing the MEMS transducer 102, the first IC 104 and other components on the front surface 616. In some implementations, the cover bonding ring 650 can include a metal material (e.g., a ferrous metal, a non-ferrous metal, copper, steel, iron, silver, gold, aluminum, titanium, etc.). By way of example, the cover bonding ring 650 may include a copper trace that is nickel and/or gold plated (e.g., gold plated over nickel plating, etc.). Such a metal cover bonding ring 650 may be soldered to the front surface 616. In other embodiments, the cover bonding ring 650 may be formed of another material (e.g., a thermoplastic material, a ceramic material, etc.). In some embodiments, the cover bonding ring 650 is adhered, fused, and/or otherwise coupled to the front surface 616 without the use of solder (e.g., adhesively coupled thereto, etc.).

To provide additional mechanical strength to the bonding between the cover 656 and the front surface 616, an under-fill adhesive 658 is disposed between the cover 656 and the front surface 616. The under-fill adhesive 658 is disposed in a space defined by a notch 652 (FIG. 6A) formed in the cover bonding ring 650. The notch 652 includes a notched surface 660 that is stepped in relation to an outer side surface 654 of the cover bonding ring 650 in a direction towards an inner side surface 662 of the cover bonding ring 650. The notched surface 660 is substantially parallel to the outer side surface 654. A length of the notched surface 660 in a direction that is substantially normal to a longitudinal axis of the cover 656 and within the plane of the front surface 616 is denoted by $L_n$. A width of the notch 652 in a direction that is along the longitudinal axis of the cover and within the plane of the front surface 616 is denoted by $W_n$. The width $W_n$ of the notch defines a distance between the notched surface 660 and the outer side surface 654. The width $W_n$ of the notch is less than the width $W_r$ of the cover bonding ring 650. This allows a portion of the cover bonding ring 650 to serve as a barrier, and reduce the risk of the under-fill adhesive 658 bleeding into the portion of the microphone device 600 covered by the cover 656, and damaging the internal components, such as the first IC 104, the MEMS transducer 102 or bonding wires 124. While FIGS. 6A and 6B show the notched cover bonding ring 650 in relation a top port design, the notched cover guard ring can also be used in bonding the cover 608 to the front surface 616 of the bottom port sixth example microphone device 600 shown in FIG. 6.

In some implementations, the notch 652 can be replaced with a gap, aperture, cut-out, or a vent, resulting in the cover bonding ring 650 being non-uniform or discontinuous. During production, the MEMS transducer 102, the cover bonding ring 650, and the cover 656 can be soldered or otherwise coupled to the substrate 610. After the MEMS transducer 102, the cover bonding ring 650, and the cover 656 are coupled together, a non-meltable adhesive or sealant in the form of an epoxy or another non-meltable material can be applied between the substrate 610, the cover bonding ring 650, and the cover 656 to effectively seal the aperture and isolate the MEMS transducer 102 within the cover 656. The epoxy and/or another non-meltable material may advantageously have a melting point higher than the solder used to couple the cover 656 and/or the cover bonding ring 650 to the substrate 610 such that the epoxy or another non-meltable material does not melt upon reflow. As a result, when the microphone device 600 is subsequently reflowed during integration or installation into a larger device (e.g., for a smartphone, a tablet, a laptop, a smart watch, a hearing aid, a video camera, a communications device, etc.), the epoxy or another non-meltable material maintains the cover 656 and/or the cover bonding ring 650 in position and does not allow the cover 656 and/or the cover bonding ring 650 to tilt, rotate, shift, or otherwise deform during the heating cycle. The sixth example microphone device 600 also can incorporate a tag, a guard ring, and other features of a microphone device as discussed in the commonly owned U.S. Patent Application No. 62/367,531, the subject matter of which is incorporated herein by reference in its entirety.

Figure 7A:
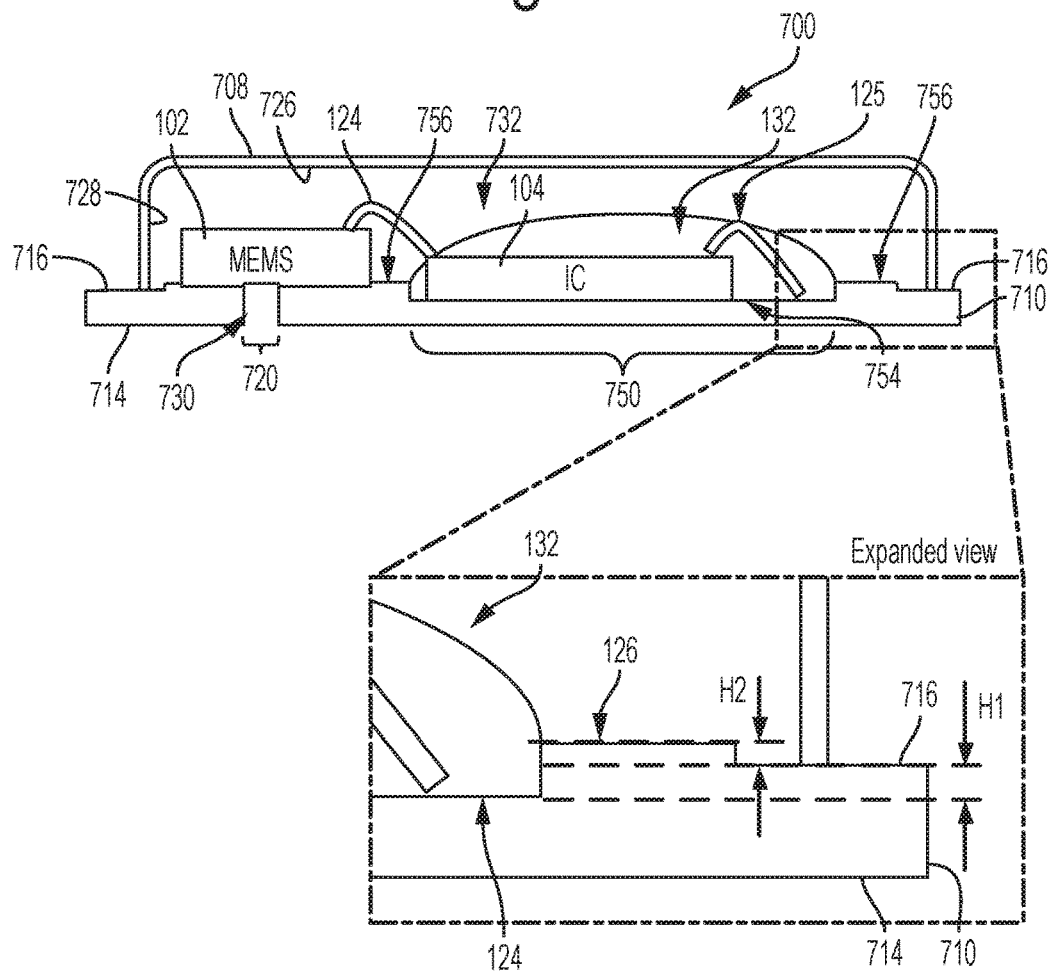
FIG. 7A is a cross-sectional view of a seventh example microphone device according to an embodiment of the present disclosure.

FIG. 7A is a cross-sectional view of a seventh example microphone device 700 according to an embodiment of the present disclosure. In particular, the seventh example microphone device 700 includes a bottom port design where a substrate 710, instead of a cover 708, defines a bottom port 720 that allows acoustic signals to be incident on the diaphragm of the MEMS transducer 102. The substrate 710 includes a first surface or a front surface 716 and an opposing second surface or back surface 714. The MEMS transducer 102 and the first IC 104 are disposed on the front surface 716. Wires 124 can extend from the MEMS transducer 102 to the first IC 104. A second set of wires 125 can extend from the first IC to the substrate 710. An encapsulating material 132 is disposed over the first IC 104 to at least partially cover the first IC 104 and the wires 125. In one or more embodiments, the encapsulating material 132 completely coves the IC 104, while at least partially covering the wires 125. The MEMS transducer 102, the first IC 104, and the wires 124 are similar to the corresponding elements with similar reference numerals discussed above in relation to the first example microphone device 100 shown in FIG. 1. In some implementations, the seventh example microphone device 700 can include a second IC (similar to the second IC 106 shown in FIG. 1) disposed over the first IC 104 and covered with the encapsulating material 132. Additional wires can extend between the second IC and the first IC 104 and the substrate 710.

The substrate 710 defines the bottom port 720, which includes an opening that extends between the front surface 716 and the back surface 714 such that the outside of the seventh example microphone device 700 is in fluid communication with the diaphragm of the MEMS transducer 102. A cover 708 is disposed over the front surface 716 of the substrate 710 and encloses the MEMS transducer 102, the first IC 104 and the wires 124 and 125. Unlike the cover 108 discussed above in relation to the first example microphone device 100, shown in FIG. 1, the cover 708 of the seventh example microphone device 700 does not include an opening. Thus, an inner top surface 726 of the cover 708, inner side surfaces 728 of the cover 708, and the exposed portions, inside the cover 708, of the front surface 716, the MEMS transducer 102, and the first IC 104 define a back volume 732 of the seventh example microphone device 700. The seventh example microphone device 700 also defines a front volume 730, which is a combined volume of a space under the MEMS transducer 102 and a volume defined by the bottom port 720.

The substrate 710 can define an encapsulating material confinement structure, which can include a surface cavity 750 in the front surface 716 of the substrate 710. The surface cavity 750 may extend from a front surface 716 of the substrate 710 to an IC mounting surface 754 of the substrate 710. In the illustrated embodiment, the front surface 716 and the IC mounting surface 754 are on separate planes. In some embodiments, the front surface 716 and the IC mounting surface 754 may be in the same plane; for example, in some embodiments, the MEMS transducer 102 may be mounted on a raised platform, such as in the manner described in further detail below, and the front surface 716 and the IC mounting surface 754 may be in the same plane. The first IC 104 is positioned on the IC mounting surface 754 of the surface cavity 750. In some embodiments, the first IC 104 is mounted on the IC mounting surface 754 using a binding material such as solder or glue. While not shown in FIG. 1, the ASIC mounting surface can include one or more conductive bonding pads to provide a connection between conductive traces on the substrate and the IC 104. The second set of wires 125 connect the bonding pads on the IC mounting surface 754 to the bonding pads on the IC 104. In some embodiments, a height H1 of the surface cavity 750 (i.e., a height from the IC mounting surface 754 to the front surface 716) can be less than the height of the IC 104, such that a portion of the IC 104 extends above the cavity.

The substrate 710 also includes a platform 756 (also referred to as "a MEMS mounting surface") that is raised up above or elevated in relation to the front surface 716. In the illustrated embodiment, the height H1 of the surface cavity 750 is greater than a height H2 by which the platform 756 is raised above the front surface 716. In some embodiments, the height H2 may be greater than or equal to the height H1. The platform 756 can be formed around the perimeter of the surface cavity 750. In some embodiments, the platform 756 can form a sidewall of the surface cavity 750. In some other embodiments, the platform 756 can be separated from the surface cavity 750 by the front surface 716. The MEMS transducer 102 is mounted on a top surface of the platform 756. The bottom port 720, discussed above, extends through the substrate 710 at a position where the MEMS transducer 102 is mounted.

The encapsulating material 132 at least partially covers the IC 104 and/or the second set of wires 125, and, in some embodiments, completely covers both the IC 104 and the second set of wires 125. The encapsulating material 132 can be a non-conductive material such as epoxy. One process stage during the manufacturing of the first example microphone device 100 can include the deposition of the encapsulating material 132 over the IC 104. The encapsulating material 132 can be deposited such that it at least partially covers (or in some instances completely covers) the IC 104 and the second set of wires 125 that extend from the IC 104 to the substrate 710. In one or more embodiments, the encapsulating material 132 completely coves the IC 104, while at least partially covering the wires 125. During deposition, the encapsulating material 132 can be in a high temperature and low viscosity state. Over time, the encapsulating material 132 cools and solidifies to form a covering over the IC 104 and the second set of wires 125. But during deposition, the low viscosity of the encapsulating material 132 can result in lateral spreading of the encapsulating material. In instances where the IC 104 and the MEMS transducer 102 are disposed on the same surface of the substrate 710, the lateral spreading of the encapsulating material 132 may result in the encapsulating material 132 making contact with the MEMS transducer 102. This may damage the MEMS transducer 102. By placing the IC 104 and the second set of wires 125 within the surface cavity 750, the lateral spreading of the encapsulating material 132, during and after deposition, is confined to within the sidewalls of the surface cavity 750. Thus, the MEMS transducer 102, and other components mounted on the substrate 710, can be protected from undesirable contact with the encapsulating material 132.

After the encapsulating material 132 solidifies, its upper surface can form a curvature that encloses the IC 104 and the second set of wires 125. In some embodiments, a height of the encapsulating material 132 can be represented by a greatest distance between a point on a top surface of the encapsulating material 132 and the IC mounting surface 754. In some embodiments, the height of the encapsulating material 132 can be equal to or greater than a greatest distance that the second set of wires 125 or the IC 104 extend from the IC mounting surface 754.

The platform 756 provides additional protection from the encapsulating material 132. That is, mounting the MEMS transducer 102 on the platform 756 further isolates the MEMS transducer 102 from the encapsulating material 132. In some embodiments, a height of the platform 756 can be based on the volume of encapsulating material 132 to be deposited to at least partially cover (or in some instances completely cover) the IC 104 and the second set of wires 125, and the available volume within the surface cavity 750.

Figure 7B:
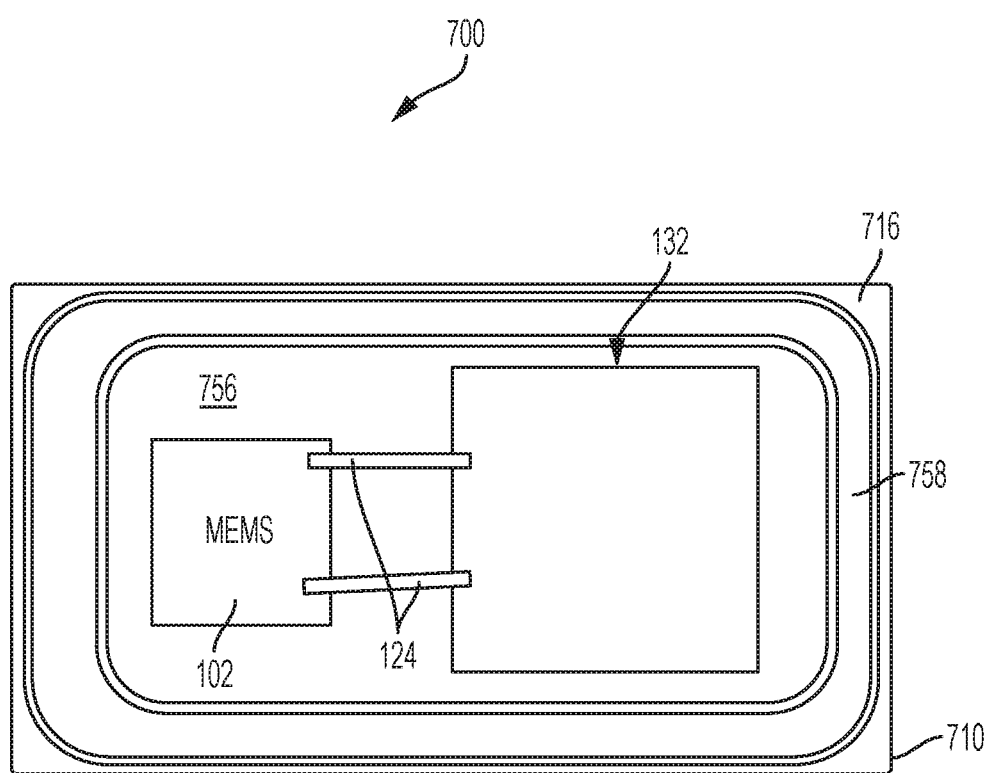
FIG. 7B depicts a top view of the seventh example microphone device shown in FIG. 7A.

FIG. 7B depicts a top view of the seventh example microphone device 700 shown in FIG. 7A. In particular, the top view is shown without the cover 708. The encapsulating material 132 at least partially covers the IC 104 and the second set of wires 125, which extend from the IC 104 to the substrate 710. In one or more embodiments, the encapsulating material 132 completely covers the IC 104 and the second set of wires 125. In one or more embodiments, the encapsulating material 132 completely covers the IC 104, while at least partially covering the wires 125. The platform 756 surrounds the encapsulating material 132, which, in the illustrated embodiment of FIG. 7B, is completely covering the surface cavity 750 shown in FIG. 7A. The first set of wires 124, which extend between the MEMS transducer 102 and the IC 104 are partially covered by the encapsulating material 132. The front surface 716 of the substrate 710 also includes a cover bonding surface 758, which facilitates bonding the cover 708 with the substrate 710. In the illustrated embodiment, the cover bonding surface 758 is separated from the platform 756 by a portion of the front surface 716 (i.e., such that, front an inner portion of the microphone device 700, the surfaces transition from the platform 756 to an inner portion of the front surface 716, then to the cover bonding surface 758, and finally to an outer portion of the front surface 716). In some embodiments, the cover bonding surface 758 may extend to the edge of the platform 756 with no intervening portion of the front surface 716. In some embodiments, the cover bonding surface 758 can be a metal surface that can bond with a metal periphery of the cover 708 using a solder or a glue. The platform 756 not only protects the MEMS transducer 102 from the encapsulating material 132, but also protects the cover bonding surface 758 from contact with the encapsulating material 132. This prevents any defect in bonding of the cover 708 to the substrate 710, which may occur if the encapsulating material 132 were to spill over to the cover bonding surface 758. In one or more embodiments, the platform 756 may not completely surround the surface cavity 750. For example, the platform 756 may extend only on one side of the surface cavity 750 that is adjacent to the MEMS transducer 102. In some other embodiments, the platform 756 may extend along a complete or partial length of one or more sides of the surface cavity 750.

Figure 7C:
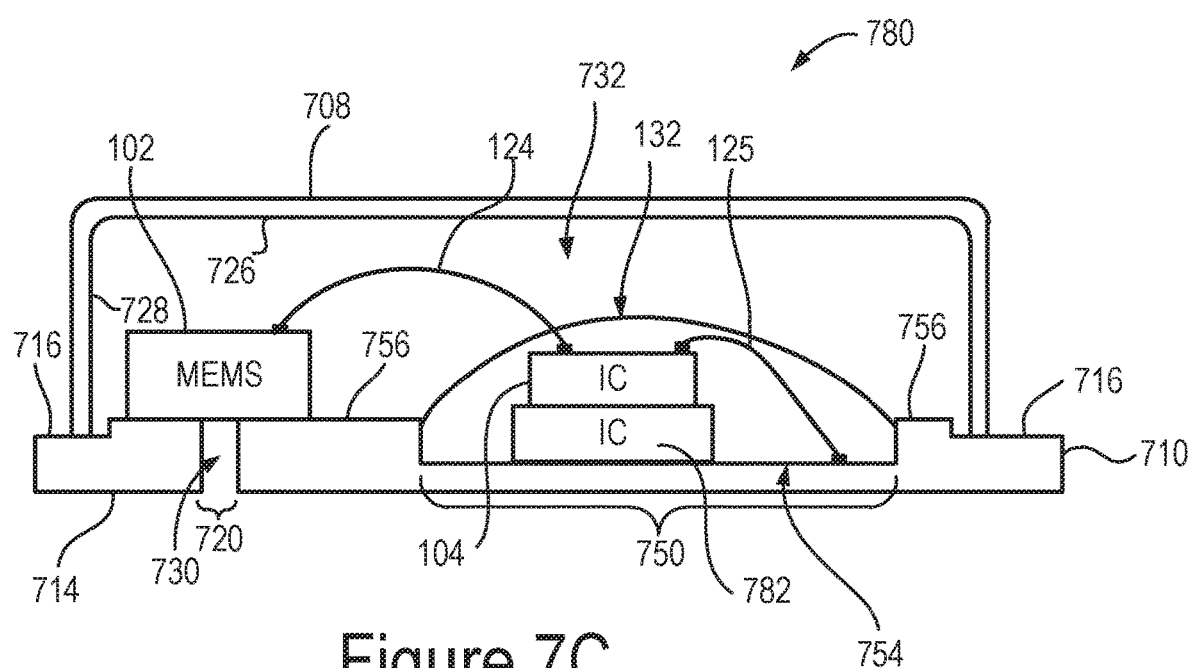
FIG. 7C shows a cross-sectional view of the seventh example microphone device shown in FIG. 7A having more than one IC.

FIG. 7C shows a cross-sectional view of the seventh example microphone device 700 shown in FIG. 7A having more than one ICs. In particular, the seventh example microphone device 700 shown in FIG. 7C includes a first IC 104 and a second IC 106, both of which are at least partially covered by the encapsulating material 132. In one or more embodiments, the encapsulating material 132 completely covers the first IC 104 and the second IC 106. In one or more embodiments, the encapsulating material 132 can completely cover the first IC 104 and the second IC 106 while at least partially covering the second set of bonding wires 125. While not shown in FIG. 7C, the seventh example microphone device 700 can include bonding wires in addition to the first set of bonding wires 124 and the second set of bonding wires 125 for forming electrical connections between the MEMS transducer 102, the first IC 104, the second IC 106 and the substrate 710. At least one of these additional bonding wires can be at least partially covered by the encapsulating material 132. The first IC 104 and the second IC 106 can be similar to the first IC 104 and the second IC 106 discussed above in relation to FIGS. 1A-5.

Figure 8:
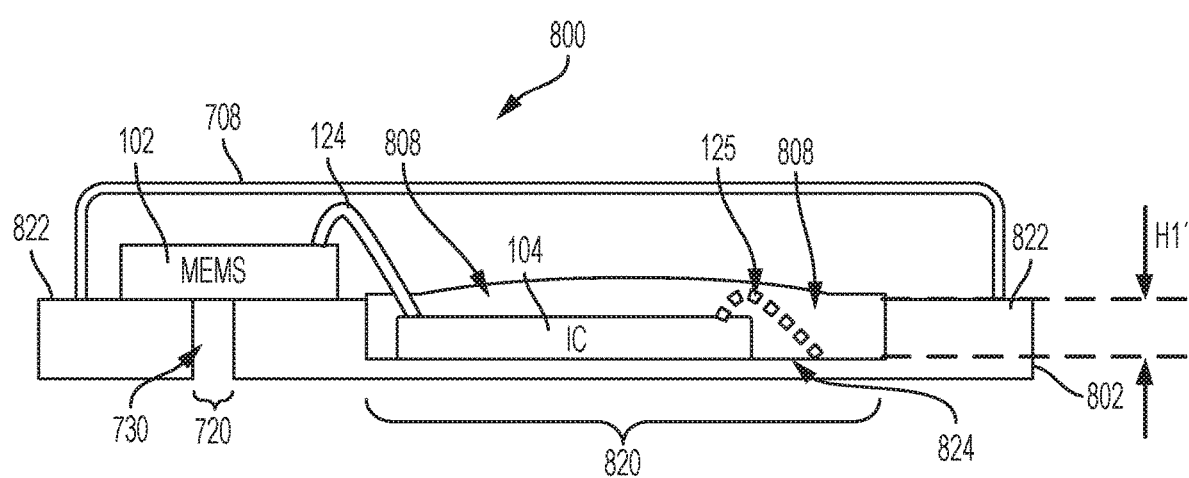
FIG. 8 shows a cross-sectional view of a eighth example microphone device according to an embodiment of the present disclosure.

FIG. 8 shows a cross-sectional view of a eighth example microphone device 800 according to an embodiment of the present disclosure. Several elements of the eighth example microphone device 800 are similar to the components of the seventh example microphone device 700 shown in FIGS. 7A and 7B. To that extent, the similar elements have been labeled with similar reference numbers. The eighth example microphone device 800 does not include a platform. The substrate 802 has a surface cavity 820 formed within a front surface 822 of the substrate 802, and a bottom surface of the surface cavity 820 serves as an IC mounting surface 824. The height H1' of the surface cavity 820 is greater than the height of the IC 104, such that the entirety of the IC 104 falls within a volume of the surface cavity 820. In some embodiments, the height H1' can be equal to or greater than the height of IC 104. In still further embodiments, the height H1' can be less than the height of the IC 104. For example, the IC 104 may be taller than the height H1' of the surface cavity 820, but the difference in the heights may be sufficiently small such that an encapsulating material 808 does not make contact with the MEMS transducer 102 and/or a cover mounting surface during deposition. By having the height of the surface cavity 820 to be greater than a height of the IC 104, the risk of spillover of the encapsulating material 808 during deposition can be reduced while ensuring that the encapsulating material 808 fully covers the IC 104 and at least a portion of the second set of wires 125. The encapsulating material 808 can be similar to the encapsulating material 132 discussed above.

The substrate 802 can also include a cover mounting surface (not shown) to facilitate bonding the cover 708 onto the front surface 822 of the substrate 202. The cover mounting surface can be similar to the cover bonding surface 758 discussed above in relation to FIG. 7B.

In one or more embodiments, more than one IC can be mounted within the surface cavity 820. For example, more than one ICs can be disposed side-by-side within the surface cavity 820. In another example, more than one ICs can be stacked on top of each other. In yet another example, more than one ICs may be both stacked on top of each other and disposed side-by-side within the surface cavity 820. The encapsulating material 808 can be deposited in the surface cavity 820 such that it at least partially covers (or in some instances, completely covers) the more than one ICs regardless of the manner in which they are arranged within the surface cavity 820.

As discussed above in relation to FIGS. 7A-8, the encapsulating materials 132 and 808 at least partially cover the IC 104 and the second set of wires 125. In one or more embodiments, the encapsulating material can completely cover the IC 104 and the second set of wires 125. In one or more embodiments, the encapsulating material 132 can completely cover the IC 104 while only partially covering the second set of wires 125. The second set of wires 125 may also be completely covered. By covering the IC 104 and the second set of wires 125 within the encapsulating material 132 or 808, an effect of radio frequency signals, generated by the IC 104 and the second set of wires 125, on the MEMS transducer 102 and other components mounted on the substrate 710 or 802 can be reduced. In some embodiments, partially or completely covering the IC 104 and partially or completely covering the wires in encapsulating material may cause a substantial reduction in noise in the microphone device as compared to a microphone device that does not include encapsulating material or only partially encapsulates an IC. By reducing the radio frequency interference, a level of noise in the electrical signals generated by the MEMS transducer 102 and the other components on the substrate 710 and 802 can be reduced. In some embodiments, an improvement in noise attenuation of about −15 dB is obtained for the microphone device having an encapsulating material completely covering the IC in comparison with a microphone device having no encapsulation material. In instances where the microphone device includes more than one IC, such as when two ICs are stacked on top of each other, the encapsulating material 132 or 808 can entirely or partially cover all of the ICs and wires connecting the ICs to the substrate.

Figure 9:
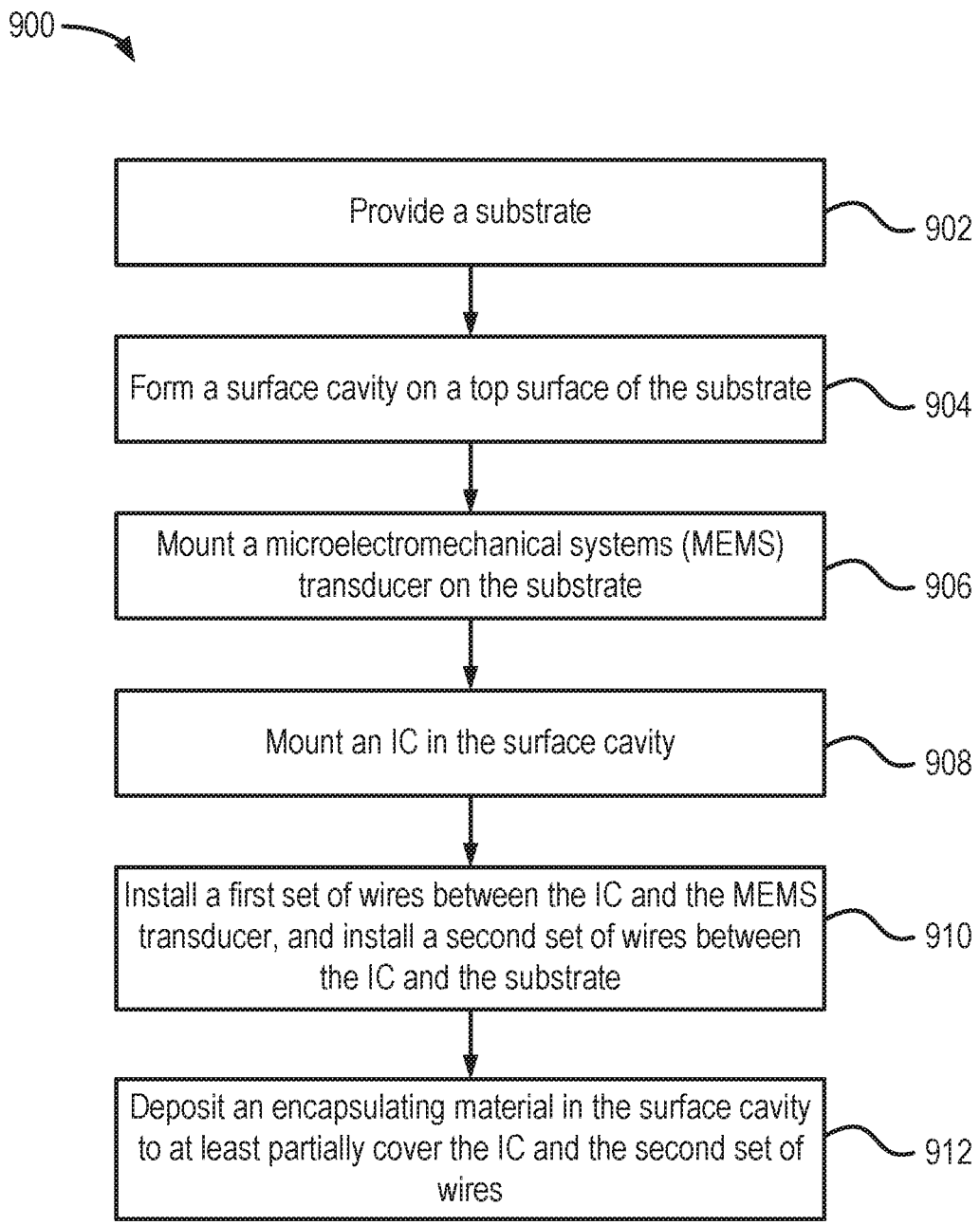
FIG. 9 shows a flow diagram of an example process for manufacturing a microphone device according to an embodiment of the present disclosure.

FIG. 9 shows a flow diagram of an example process 900 for manufacturing a microphone device according to the embodiments of the present disclosure. The process 900 includes providing a substrate (stage 902), forming an surface cavity on a front surface of the substrate (stage 904), mounting a MEMS transducer on the substrate (stage 906), mounting an IC on an IC mounting surface in the surface cavity (stage 908), installing a first set of bonding wires between the IC and the MEMS transducer, and a second set of wires between the IC and the substrate (stage 910), and depositing an encapsulation material into the surface cavity to at least partially cover (or in some instances, completely cover) the IC and the second set of wires (stage 912). It should be noted that the order of stages described herein is provided by way of example only, and the present disclosure is not limited to any particular order of performing the stages. For example, in some embodiments, the MEMS transducer may be mounted prior to mounting of the IC, while in other embodiments, the IC may be mounted prior to mounting of the MEMS transducer.

The process 900 includes providing a substrate (stage 902). As discussed above in relation to FIGS. 7A-8, the substrate can include a printed circuit board or a semiconductor material. In some embodiments, the substrate can be similar to the substrate 710 or the substrate 802 shown in FIGS. 7A-8. The substrate can include a single-layered or a multilayered printed circuit board, where each layer can include a set of conductive traces separated by insulators. The conductive traces can be patterned based on the locations connectivity of the components, such as the MEMS transducer and the IC to be mounted on the substrate.

The process 900 further includes creating a surface cavity on a front surface of the substrate (stage 904). One example implementation of this process stage is discussed above in relation to FIGS. 7A-8. The surface cavity 750 is created on a front surface 716 of the substrate 710. In another example, as shown in FIG. 8, the surface cavity 820 is formed on the front surface 822 of the substrate 802. In some embodiments, the cavity in the front surface of the substrate can be created using one or more of chemical etching, a photoengraving routing, stamping or blanking through a substrate layer, and the like. The bottom of the cavity can form an IC mounting surface for mounting an IC. The IC mounting surface can include one or more bonding pads that can be connected to bonding pads on the IC using wire bonding. In some embodiments, the process 900 also can include forming a ledge or a platform adjacent to the surface cavity. One example of such a platform is discussed above in relation to FIGS. 7A-8. In one or more embodiments, the platform can be formed by etching the surface of the substrate around the desired location of the platform. In some other embodiments, the platform can be formed by depositing additional layers of the substrate at the desired location of the platform. In one or more embodiments, the substrate and the platform can be formed of the same material. In one or more embodiments, the substrate and the platform can be formed of different materials. For example, materials used for forming the substrate and the platform can include materials such as fiberglass, epoxy resin, and solder mask.

The process 900 further includes mounting a MEMS transducer on a front surface of the substrate (stage 906) and mounting an IC on an IC mounting surface (stage 908). Example implementations of these process stages are discussed above in relation to FIGS. 7A-8. For example, as shown in FIGS. 7A-8, the MEMS transducer 102 is mounted on the substrate 710 or 802, and the IC 104 is mounted on the IC mounting surface 754 or 824. The MEMS transducer 102 and the IC 104 can be mounted manually or by machine (e.g., using a "pick and place machine"). In some embodiments, flip-chip techniques also can be used to mount the MEMS transducer 102 and the IC 104.

The process 900 also includes installing a first set of bonding wires between the IC and the MEMS transducer, and a second set of wires between the IC and the substrate (stage 910). Examples of the implementation of this process stage are discussed above in relation to FIGS. 7A-8. For example, a first set of wires 124 are installed to electrically connect the MEMS transducer 102 to the IC 104. A second set of wires 125 are installed to electrically connect the IC 104 to conductive traces on the substrate 710. The first set of wires 124 and the second set of wires 125 can include conductive materials such as aluminum, copper, silver, gold, and the like. The wires can be installed using techniques such as ball bonding and wedge bonding.

The process 900 additionally includes depositing an encapsulation material into the surface cavity to at least partially cover the IC and the second set of wires (stage 912). Examples of the implementation of this process stage are discussed above in relation to FIGS. 7A-8. For example, as shown in FIGS. 7A and 8, the encapsulating material 132 at least partially or completely covers the IC 104 and the second set of wires 125. Similarly, as shown in FIG. 8, the encapsulating material 808 at least partially or completely covers the IC 104 and the second set of wires 125. In some embodiments, the encapsulating material can be an epoxy, or materials such as resins, polymers, glass, plastic, and the like. Before deposition, the encapsulating material can be heated to a predetermined temperature to allow the encapsulating material to flow. The heated epoxy can be deposited in the surface cavity such that it at least partially covers (or in some instances, completely covers) the IC and the second set of wires that connect the IC to the substrate. During deposition, the sidewalls of the surface cavity confine the encapsulating material to within the cavity, and reduce the risk of the encapsulating material coming in contact with the MEMS transducer or other components on the substrate. The deposited encapsulating material can be given time to settle into a steady state with regard to flow within the surface cavity. If in the steady state, portions of the IC or the second set of wires remain exposed, additional encapsulating material can be added. The encapsulating material can then be cooled until it solidifies.

It should be noted that process stages in the process 900 depicted in FIG. 9 can be performed in an order different from the one shown in FIG. 9. For example, mounting the IC in the surface cavity (stage 908) can be carried out before mounting the MEMS transducer on the substrate (stage 906). Further, installation of the wires between the IC and the MEMS transducer and the IC and the substrate (stage 910) can be carried out in any order.

Figure 10A:
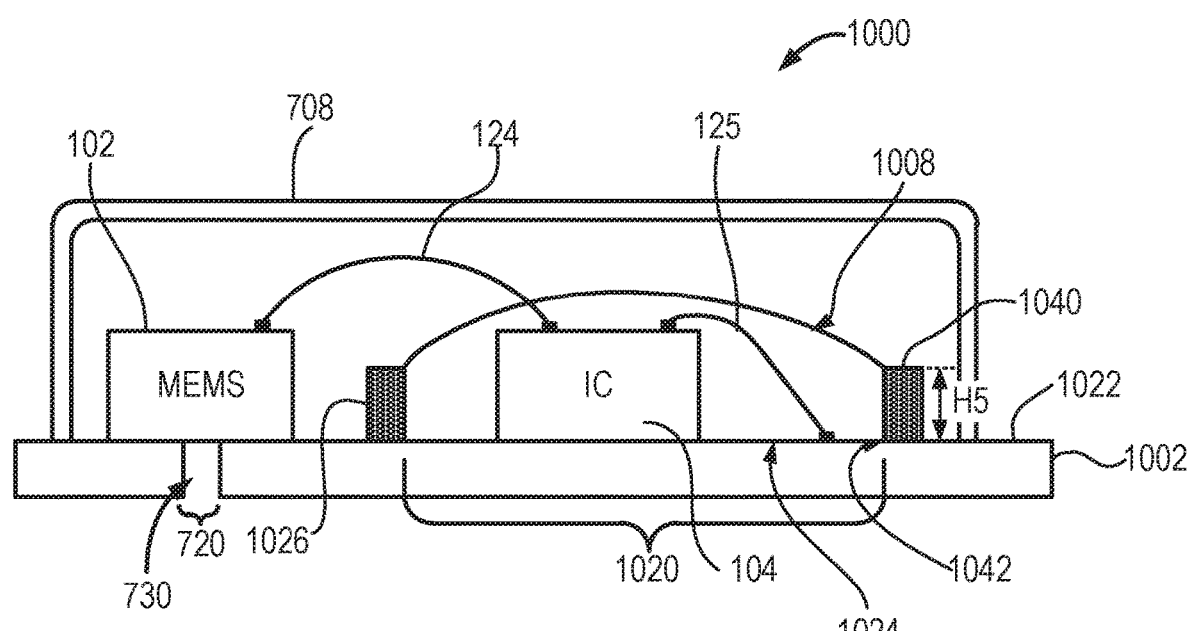
FIGS. 10A and 10B depict a cross-sectional view and a top view, respectively, of a ninth example microphone device according to an embodiment of the present disclosure.
Figure 10B:
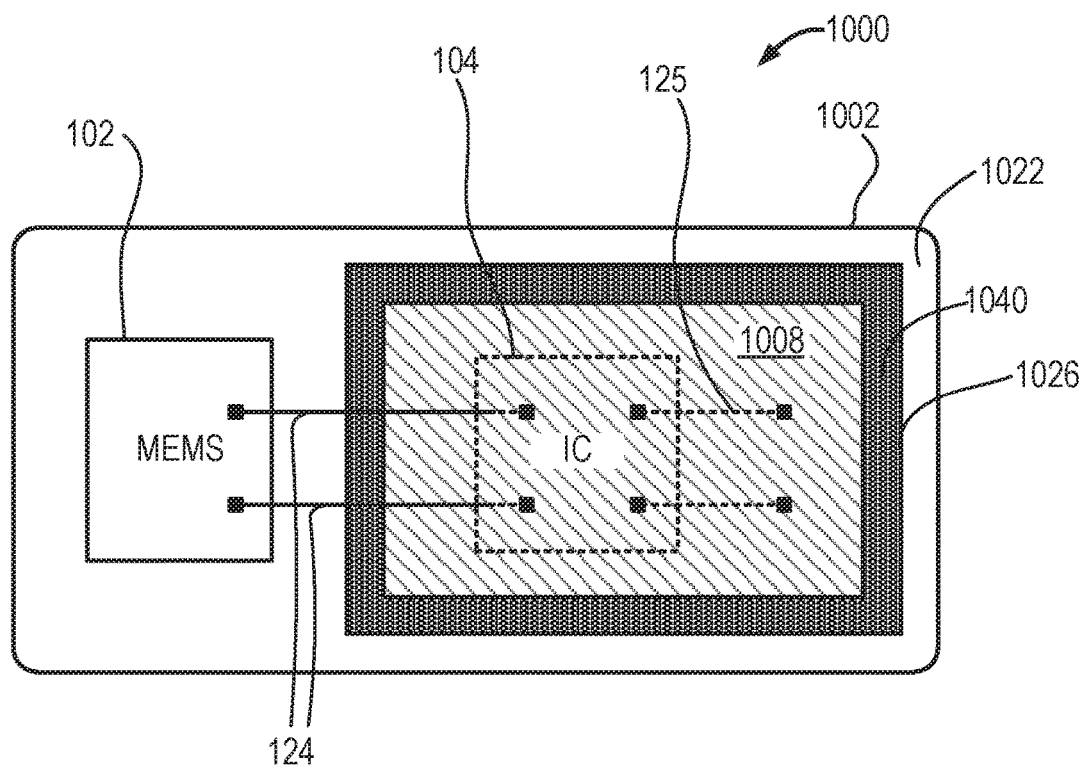

FIGS. 10A and 10B depict a cross-sectional view and a top view, respectively, of a ninth example microphone device 1000 according to an embodiment of the present disclosure. In the ninth example microphone device 1000 shown in FIGS. 10A and 10B, a encapsulating material confinement structure includes a surface cavity 1020 formed by a wall 1026 that rises or protrudes above a front surface 1022 of the substrate 1002. The wall 1026 has a top surface 1040 that is positioned at a height H5 above the front surface 1022 of the substrate 1002. The height H5 can be greater than, equal to, or less than a height of the IC 104. A periphery 1042 of the wall 1026 defines an edge of the surface cavity 1020. The IC 104 is mounted on a mounting surface 1024 that is a portion of the front surface 1022 of the substrate 1002. The MEMS transducer 102 is also mounted on the front surface 1022 of the substrate 1002. Thus, the IC 104 and the MEMS transducer 102 are mounted on coplanar surface portions of the substrate 1002.

The encapsulating material 1008 is deposited within the surface cavity 1020 and at least partially covers the IC 104 and at least partially covers the second set of wires 125. In one or more embodiments, the encapsulating material 1008 completely covers the IC 104 and the second set of wires 125. In one or more embodiments, the encapsulating material 1008 completely covers the IC 104, while at least partially covering the second set of wires 125.

The wall 1026 can completely surround the IC 104 and a portion of the front surface 1022 of the substrate 1002. In one or more embodiments, the wall 1026 can be discontinuous. In one or more embodiments, the wall 1026 may not entirely surround the IC 104. For example, the wall 1026 may extend between the MEMS transducer 102 and the IC 104, so as to reduce the risk of the encapsulating material 1008 making contact with the MEMS transducer 102 during and after deposition. In one or more embodiments, the wall 1026 can be incorporated in the seventh and the eighth example microphone devices 700 and 800 discussed above in relation to FIGS. 7A-8. In some embodiments, the top surface 1040 can be considered a top or front surface of the substrate, such that the cavity is formed in part or in whole as an area surrounded by the wall 1026. In some implementations, ninth example microphone device 1000 can include ICs in addition to the IC 104. In some such implementations, the encapsulating material 1008 can cover partially or completely all of the ICs and the wires connecting those ICs to the substrate 1002.

Figure 11:
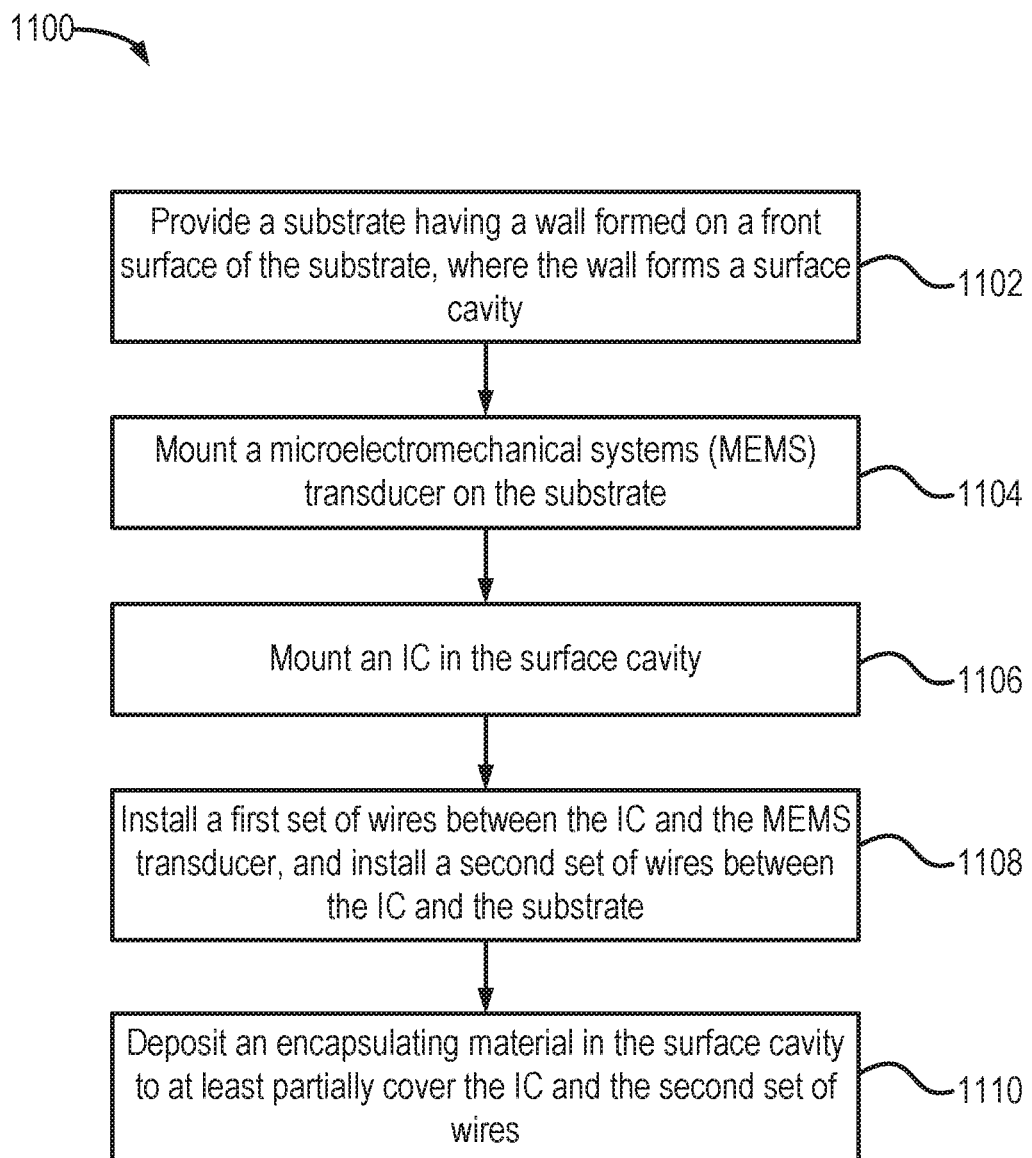
FIG. 11 shows a flow diagram of an example process for manufacturing a microphone device according to an embodiment of the present disclosure.

FIG. 11 shows a flow diagram of an example process 1100 for manufacturing a microphone device according to an embodiment of the present disclosure. In particular, the process 1100 can be utilized for manufacturing the third example microphone device discussed above in relation to FIGS. 10A and 10B, in some embodiments. The process 1100 includes providing a substrate having a wall formed on a front surface of the substrate, where the wall forms an surface cavity (stage 1102); mounting a MEMS transducer on the substrate (stage 1104), mounting an IC on an IC mounting surface in the surface cavity (stage 1106), installing a first set of bonding wires between the IC and the MEMS transducer, and a second set of wires between the IC and the substrate (stage 1108), and depositing an encapsulation material into the surface cavity to at least partially cover (or in some instances, completely cover) the IC and the second set of wires (stage 1110).

The process 1100 includes providing a substrate having a wall formed on a front surface of the substrate, where the wall forms an surface cavity (stage 1102). On example of this process stage is discussed above in relation to FIGS. 10A and 10B, where the wall 1026 forms an surface cavity 1020 on the substrate 1002. In one or more embodiments, the wall 1026 can be formed of the same material as the substrate. For example, the wall can be formed by depositing additional layers of the substrate material. In one or more embodiments, the wall can be formed using a solder mask, a solder stop mask, or a solder resist. Multiple layers of the solder mask can be deposited around the IC in the desired pattern to form the wall. Stages 1104-1110 can be performed in a manner similar to that discussed above in relation to stages 906-912. It should be noted that the order of stages described herein is provided by way of example only, and the present disclosure is not limited to any particular order of performing the stages. For example, in some embodiments, the MEMS transducer may be mounted prior to mounting of the IC, while in other embodiments, the IC may be mounted prior to mounting of the MEMS transducer.

Various example embodiments discussed herein can provide substantial advantages over existing designs, such as substrate-embedded IC packages. In such packages, the IC is completely surrounded by the substrate material, and is embedded inside the substrate during the manufacturing process of the substrate. However, embedding the IC inside the substrate raises overall cost of the microphone device. For example, defects in substrate can cause a good IC embedded in the defected substrate to be discarded along with the defected substrate. Further, there is an increased burden in the design phase to finalize the designs of the IC and the substrate early in the manufacturing process because of the additional lead-time needed to embed the IC into the substrate. Further, the inventory of ICs is held up inside the substrate. Various embodiments discussed herein, on the other hand, allow the microphone device to be manufactured with established substrate and semiconductor processes, as the IC is encapsulated after the manufacture of the substrate. Moreover, the IC inventory is not held up during the manufacture of the substrate. This reduces the complexity of the manufacturing process of an encapsulated IC and reduces the time to market.

Figure 12:
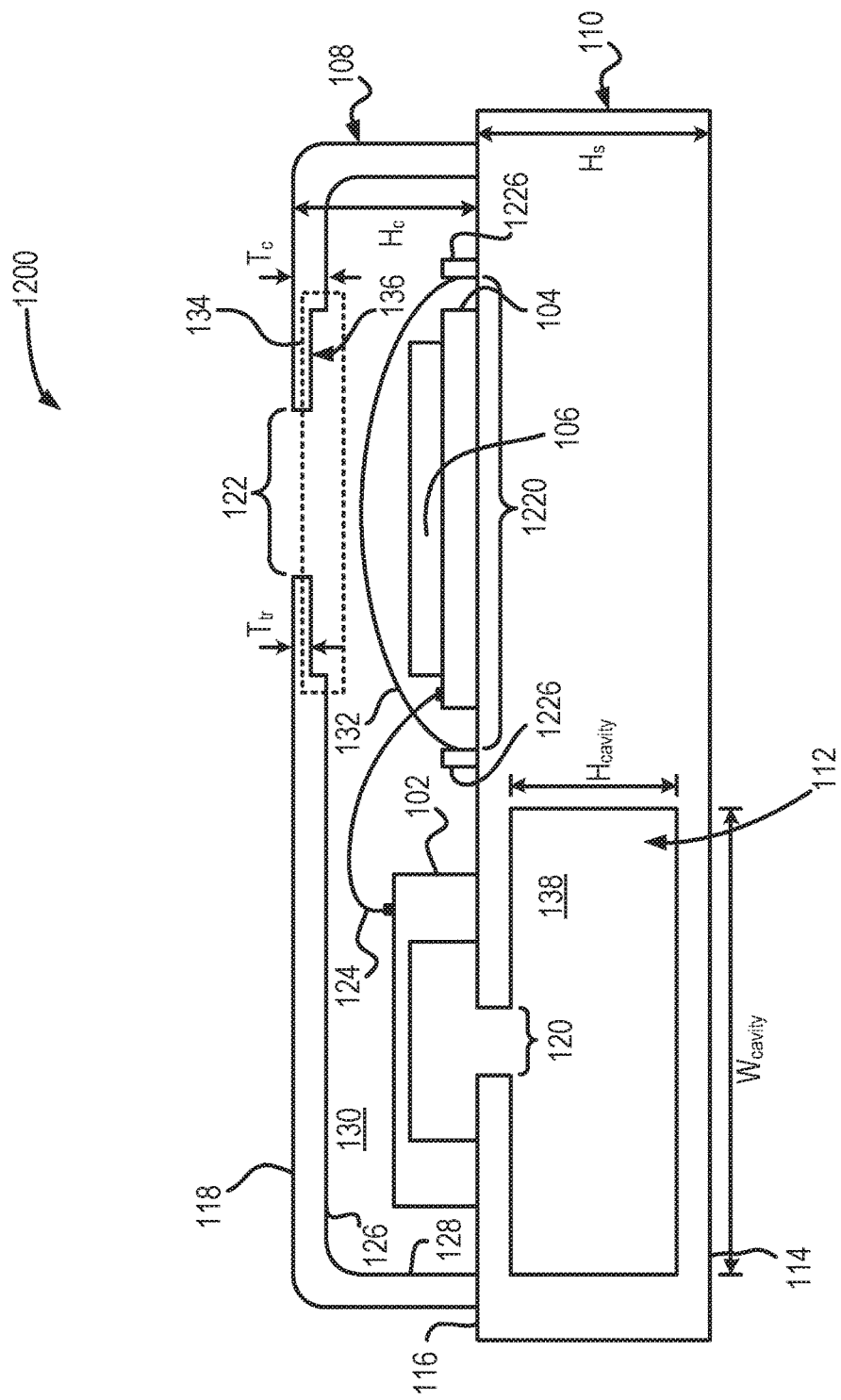
FIG. 12 shows a cross-sectional view of a tenth example microphone device according to an embodiment of the present disclosure.

FIG. 12 shows a cross-sectional view of a tenth example microphone device 1200. The tenth example microphone device 1200 is similar in many respects to the second example microphone device 200 discussed above in relation to FIG. 2. To the extent that some features of the tenth example microphone device 1200 are similar to those of the second example microphone device 200, such features are provided with the same reference numerals in both FIGS. 2 and 12. The tenth example microphone device 1200 includes at least one wall 1226 positioned on the front surface 116 of the substrate between the MEMS transducer 102 and the first and second ICs 104 and 106. The wall 1226 can be similar to the wall 1026 discussed above in relation to the ninth example microphone device 1000 shown in FIGS. 10A and 10B, and can define a surface cavity 1220. In one or more embodiments, the wall 1226 can be discontinuous, and may be disposed only between the MEMS transducer 102 and the first and second ICs 104 and 106.

While the above discussion describes various embodiments, each having various features, it is understood that features described in one embodiment, can be incorporated in other embodiments as well. For instance, the first example microphone device 100 shown in FIG. 1 can include one or more features of each of the example microphone devices discussed in relation to FIGS. 2-12. For example, the first example microphone device 100 can include, without limitation, one or more of the encapsulating material 132 (FIG. 2), a thin region 134 (FIG. 2), a sealed port 140 (FIG. 3), a die attach film 142 (FIG. 3), a multilayered substrate 410 (FIGS. 4A and 4B), a particulate filter (also referred to as "a particulate barrier") 502, a cover bonding ring 650 with a notch 652 (FIGS. 6A and 6B), a surface cavity 750 (FIG. 7A), a surface cavity 820 (FIG. 8), a wall 1026 (FIG. 10A), and a wall 1226 (FIG. 12).

The second example microphone device 200 shown in FIG. 2 can include one or more features of each of the example microphone devices discussed in relation to FIGS. 1, 3-12. For example, the second example microphone device 200 can include, without limitation, one or more of a sealed port 140 (FIG. 3), a die attach film 142 (FIG. 3), a multilayered substrate 410 (FIGS. 4A and 4B), a particulate filter 502, a cover bonding ring 650 with a notch 652 (FIGS. 6A and 6B), a surface cavity 750 (FIG. 7A), a surface cavity 820 (FIG. 8), a wall 1026 (FIG. 10A), and a wall 1226 (FIG. 12).

The third example microphone device 300 shown in FIG. 3 can include one or more features of each of the example microphone devices discussed above in relation to FIGS. 1-2, 4-12. For example, the third example microphone device 300 can include, without limitation, one or more of a multilayered substrate 410 (FIGS. 4A and 4B), a particulate filter 502, a cover bonding ring 650 with a notch 652 (FIGS. 6A and 6B), a surface cavity 750 (FIG. 7A), a surface cavity 820 (FIG. 8), a wall 1026 (FIG. 10A), and a wall 1226 (FIG. 12).

The fourth example microphone device 400 shown in FIGS. 4A and 4B can include one or more features of each of the example microphone devices discussed above in relation to FIGS. 1-3, 5-12. For example, the fourth example microphone device 400 can include, without limitation, one or more of a die attach film 142 (FIG. 3), a particulate filter 502 (FIG. 5), a cover bonding ring 650 with a notch 652 (FIGS. 6A and 6B), a surface cavity 750 (FIG. 7A), a surface cavity 820 (FIG. 8), a wall 1026 (FIG. 10A), and a wall 1226 (FIG. 12).

The fifth example microphone device 500 shown in FIG. 5 can include one or more features of each of the example microphone devices discussed above in relation to FIGS. 1-4B, 6A-12. For example, the fifth example microphone device 500 can include, without limitation, one or more of a sealed port 140 (FIG. 3), a die attach film 142 (FIG. 3), a multilayered substrate 410 (FIGS. 4A and 4B), a cover bonding ring 650 with a notch 652 (FIGS. 6A and 6B), a surface cavity 750 (FIG. 7A), a surface cavity 820 (FIG. 8), a wall 1026 (FIG. 10A), and a wall 1226 (FIG. 12).

The sixth example microphone device 600 shown in FIGS. 6A and 6B can include one or more features of each of the example microphone devices discussed above in relation to FIGS. 1-5, 7A-12. For example, the sixth example microphone device 600 can include, without limitation, one or more of an encapsulating material 132 (FIG. 2), a thin region 134 (FIG. 2), a sealed port 140 (FIG. 3), a die attach film 142 (FIG. 3), a multilayered substrate 410

(FIGS. 4A and 4B), a particulate filter 502 (FIG. 5), a surface cavity 750 (FIG. 7A), a surface cavity 820 (FIG. 8), a wall 1026 (FIG. 10A), and a wall 1226 (FIG. 12).

The seventh example microphone device 700 shown in FIGS. 7A-7C can include one or more features of each of the example microphone devices discussed above in relation to FIGS. 1-6B, 8-12. For example, the seventh example microphone device 700 can include, without limitation, one or more of a die attach film 142 (FIG. 3), a multilayered substrate 410 (FIGS. 4A and 4B), a particulate filter 502 (FIG. 5), a cover bonding ring 650 with a notch 652 (FIGS. 6A and 6B), a surface cavity 820 (FIG. 8), a wall 1026 (FIG. 10A), and a wall 1226 (FIG. 12).

The eighth example microphone device 800 shown in FIG. 8 can include one or more features of each of the example microphone devices discussed above in relation to FIGS. 1-7C, 9-12. For example, the eighth example microphone device 800 can include, without limitation, one or more of a die attach film 142 (FIG. 3), a multilayered substrate 410 (FIGS. 4A and 4B), a particulate filter 502 (FIG. 5), a cover bonding ring 650 with a notch 652 (FIGS. 6A and 6B), multiple ICs 104 and 106 (FIG. 7C), a surface cavity 750 (FIG. 7A), a wall 1026 (FIG. 10A), and a wall 1226 (FIG. 12).

The ninth example microphone device 1000 shown in FIGS. 10A and 10B can include one or more features of each of the example microphone devices discussed in relation to FIGS. 1-9, and 12. For example, the ninth example microphone device 1000 can include, without limitation, one or more of a die attach film 142 (FIG. 3), a multilayered substrate 410 (FIGS. 4A and 4B), a particulate filter 502 (FIG. 5), a cover bonding ring 650 with a notch 652 (FIGS. 6A and 6B), multiple ICs 104 and 106 (FIG. 7C), a surface cavity 750 (FIG. 7A), and a surface cavity 820 (FIG. 8).

The tenth example microphone device 1200 shown in FIG. 12 can include one or more features of each of the example microphone devices discussed in relation to FIGS. 1-11. For example, the tenth example microphone device 1200 can include, without limitation, one or more of a sealed port 140 (FIG. 3), a die attach film 142 (FIG. 3), a multi-layered substrate 410 (FIGS. 4A and 4B), a particulate filter 502, a cover bonding ring 650 with a notch 652 (FIGS. 6A and 6B), a surface cavity 750 (FIG. 7A), and a surface cavity 820 (FIG. 8).

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone device, comprising:
a housing including a substrate and a cover disposed over the substrate, the housing including a sound port between the interior of the housing and the exterior of the housing;
a microelectromechanical systems (MEMS) transducer and an integrated circuit (IC) positioned within the housing and mounted on a common surface of the housing, the MEMS transducer electrically connected to the IC, and the IC electrically connected to a conductor on the substrate;
an encapsulating material covering the IC; and
an encapsulating material confinement structure disposed between the MEMS transducer and the IC, wherein the encapsulating material confinement structure at least partially confines the encapsulating material around the IC.

2. The microphone device of claim 1, wherein the encapsulating material completely covers the IC.

3. The microphone device of claim 1, wherein the encapsulating material confinement structure includes a wall portion disposed between the MEMS transducer and the IC.

4. The microphone device of claim 3, wherein the substrate is the common surface of the housing, wherein the MEMS transducer and the IC are mounted on coplanar surface portions of the substrate, wherein the wall portion protrudes above the coplanar surface portions of the substrate and the encapsulating material is at least partially confined by the wall portion.

5. The microphone device of claim 4, wherein the wall portion is a discrete member disposed on the substrate.

6. The microphone device of claim 3, wherein the wall portion is formed of a different material than the substrate.

7. The microphone device of claim 3, wherein the wall portion completely surrounds the IC.

8. The microphone device of claim 3, wherein the substrate is the common surface of the housing, wherein the substrate defines a cavity including an IC mounting surface portion on which the IC is mounted, the wall portion forming a portion of the cavity, wherein the MEMS transducer is mounted on a MEMS mounting surface portion of the substrate, the MEMS mounting surface portion elevated relative to the IC mounting surface portion, wherein the encapsulating material is at least partially confined in the cavity.

9. The microphone device of claim 8, wherein the cover is mounted on a cover mounting surface portion of the substrate, and the MEMS mounting surface portion is raised above the cover mounting surface portion of the substrate, and the cover mounting surface portion of the substrate is raised above the IC mounting surface portion.

10. The microphone device of claim 8, wherein the cover is mounted on a cover mounting surface portion of the substrate, and the MEMS mounting surface portion and the cover mounting surface portion are coplanar.

11. The microphone device of claim 8, wherein the MEMS mounting surface portion is a platform that completely surrounds the entire periphery of the cavity.

12. The microphone device of claim 1, wherein the IC includes two ICs covered by the encapsulating material.

13. The microphone device of claim 1, wherein the IC is a flip-chip mounted on the substrate.

14. The microphone device of claim 1, further comprising:
a set of wires interconnecting the IC to the conductor on the substrate, the set of wires at least partially covered by the encapsulating material;
a cavity disposed in the substrate and including a wall portion forming the encapsulating material confinement structure, the cavity including an IC mounting surface portion on which the IC is mounted, wherein the encapsulating material is at least partially confined by the cavity.

15. The microphone device of claim 1, further comprising:
a set of wires interconnecting the IC to the conductor on the substrate, the set of wires at least partially covered by the encapsulating material;
the encapsulating material confinement structure including a wall portion disposed between the MEMS transducer and the IC, and
the MEMS transducer and the IC mounted on coplanar surface portions of the substrate, wherein the encapsulating material is at least partially confined by the wall portion.

16. The microphone device of claim 1, wherein the encapsulating material comprises epoxy.

17. The microphone device of claim 1, further comprising an electrically conductive heat shield at least partially covering the IC.

18. The microphone device of claim 17, wherein the electrically conductive heat shield is disposed between a first layer of the encapsulating material and a second layer of the encapsulating material.

19. The microphone device of claim 17, wherein the electrically conductive heat shield is electrically connected to a ground plane disposed on the substrate.

20. The microphone device of claim 1, wherein the sound port is positioned in the substrate.

* * * * *